US012336377B2

(12) United States Patent
Shin et al.

(10) Patent No.: US 12,336,377 B2
(45) Date of Patent: Jun. 17, 2025

(54) DISPLAY DEVICE INCLUDING A SEALING STRUCTURE

(71) Applicant: LG DISPLAY CO., LTD., Seoul (KR)

(72) Inventors: Joohwan Shin, Goyang-si (KR); Dohyung Kim, Goyang-si (KR); Minjoo Kang, Seoul (KR); Jinho Kim, Paju-si (KR); Heechul Lim, Paju-si (KR); Eunjin Kim, Gunpo-si (KR); Kitaek Cho, Seoul (KR); Hongdae Shin, Paju-si (KR); Sinwoo Lee, Seoul (KR); Minho Oh, Seoul (KR); Jaeho Choi, Gyeongju-si (KR); Kyounghoon Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 689 days.

(21) Appl. No.: 17/511,287

(22) Filed: Oct. 26, 2021

(65) Prior Publication Data

US 2022/0131107 A1 Apr. 28, 2022

(30) Foreign Application Priority Data

Oct. 27, 2020 (KR) .................. 10-2020-0140258
Sep. 15, 2021 (KR) .................. 10-2021-0123246

(51) Int. Cl.
*H10K 50/844* (2023.01)
*H10K 59/131* (2023.01)
*H10K 71/00* (2023.01)
*H10K 59/12* (2023.01)

(52) U.S. Cl.
CPC ......... *H10K 50/844* (2023.02); *H10K 59/131* (2023.02); *H10K 71/00* (2023.02); *H10K 59/1201* (2023.02)

(58) Field of Classification Search
CPC .... H10K 50/844; H10K 59/131; H10K 71/00; H10K 59/1201; H10K 59/871; H10K 59/873; H10K 59/874; H10K 59/8794
See application file for complete search history.

(56) References Cited

U.S. PATENT DOCUMENTS 8,497,627 B2 7/2013 Lee et al.
9,448,441 B2 9/2016 Moriwaki
9,768,411 B2 9/2017 Lee et al.
(Continued)

FOREIGN PATENT DOCUMENTS

CN 101867024 A 10/2010
CN 104335111 A 2/2015
(Continued)

*Primary Examiner* — Nelson Garces
(74) *Attorney, Agent, or Firm* — Birch, Stewart, Kolasch & Birch, LLP

(57) ABSTRACT

Discussed is a display device including an array substrate having a display area, a non-display area positioned outside the display area, a light-emitting array, and a sealing structure disposed on the array substrate, wherein the sealing structure seals the light-emitting array, and fixes a plate-shaped reinforcing substrate facing toward the sealing structure to the array substrate, wherein the sealing structure includes a first adhesive layer facing toward the array substrate, a second adhesive layer facing toward the reinforcing substrate, and a barrier layer disposed between the first adhesive layer and the second adhesive layer.

20 Claims, 28 Drawing Sheets

(56) References Cited

U.S. PATENT DOCUMENTS

| | | | |
|---|---|---|---|
| 10,062,855 | B2 | 8/2018 | Yoo et al. |
| 10,191,313 | B2 | 1/2019 | Qui et al. |
| 10,969,892 | B2 | 4/2021 | Kim |
| 2017/0037238 | A1 | 2/2017 | Kushihara et al. |
| 2017/0142837 | A1 | 5/2017 | Kim et al. |
| 2019/0014402 | A1 | 1/2019 | Ahn et al. |
| 2019/0064615 | A1 | 2/2019 | Lim et al. |
| 2020/0204924 | A1 | 6/2020 | Kim et al. |
| 2021/0399259 | A1* | 12/2021 | Kim ................... G06F 1/1656 |
| 2022/0131107 | A1 | 4/2022 | Shin et al. |

FOREIGN PATENT DOCUMENTS

| | | |
|---|---|---|
| CN | 104681579 A | 6/2015 |
| CN | 106298691 A | 1/2017 |
| CN | 111221432 A | 6/2020 |
| CN | 217387160 U | 9/2022 |
| JP | 2006-201786 A | 8/2006 |
| JP | 2010-243742 A | 10/2010 |
| JP | 2011-27811 A | 2/2011 |
| JP | 2019-517035 A | 6/2019 |
| JP | 2019-211759 A | 12/2019 |
| KR | 10-2017-0016797 A | 2/2017 |
| KR | 10-2017-0073993 A | 6/2017 |
| KR | 10-1839954 B1 | 3/2018 |
| KR | 10-2019-0004008 A | 1/2019 |
| KR | 20190004008 A * | 1/2019 |
| KR | 10-2019-0028058 A | 3/2019 |
| KR | 10-2020-0026695 A | 3/2020 |
| KR | 10-2020-0080752 A | 7/2020 |
| KR | 20200080752 A * | 7/2020 |
| KR | 10-2021-0019799 A | 2/2021 |
| KR | 10-2244289 B1 | 4/2021 |
| WO | WO 2014/065126 A1 | 5/2014 |

\* cited by examiner

| Properties \ Material | Invar | Al 1.0mm | Al 1.5mm |
|---|---|---|---|
| Max temperature | 40.3℃ | 34.6℃ | 34.0℃ |
| ΔT | - | 5.7℃(▼) | 6.3℃(▼) |
| Afterimage reduction rate | - | 22.8%(▲) | 25.2%(▲) |

| Panel No. | Force applied to panel | | | | |
|---|---|---|---|---|---|
| | 1kgf | 2kgf | 3kgf | 4kgf | 5kgf |
| Comparative example | O | O | O | O | NG |
| First Experimental Example | O | O | O | O | O |
| Second Experimental Example | O | O | O | O | O |
| Third Experimental Example | O | O | O | O | O |
| Fourth Experimental Example | O | O | O | O | O |
| Fifth Experimental Example | O | O | O | NG | NG |

| Panel No. | Initial warpage amount | | | | Warpage amount after increase of temperature to 70 degrees C (Unit:mm) | | | |
|---|---|---|---|---|---|---|---|---|
| | 1 | 2 | 3 | 4 | 1 | 2 | 3 | 4 |
| First Experimental Example | 0 | 0 | 0 | 0 | 2.5 | 4 | 3.5 | 6 |
| Second Experimental Example | 0 | 0 | 0 | 0 | 10 | 8 | 14.5 | 9 |
| Third Experimental Example | 0 | 0 | 0 | 0 | Damaged | 9.5 | 11 | 10 |

FIG. 24

DISPLAY DEVICE INCLUDING A SEALING STRUCTURE

CROSS-REFERENCE TO RELATED APPLICATIONS

The present application claims priority to and the benefit of Korean Patent Application No. 10-2020-0140258 filed on Oct. 27, 2020, and Korean Patent Application No. 10-2021-0123246 filed on Sep. 15, 2021 in the Korean Intellectual Property Office, the entire contents of which are hereby expressly incorporated by reference in their entirety into the present application.

BACKGROUND OF THE DISCLOSURE

Field

The present disclosure relates to a display device including a sealing structure for sealing a light-emissive element.

Description of Related Art

A display device is applied to various electronic devices such as TVs, mobile phones, laptops and tablets, among others. To this end, research to develop a thinner, lighter and lower power consumption display device is continuing.

Examples of display devices include a liquid crystal display device (LCD), a plasma display device (PDP), a field emission display device (FED), an electro-wetting display device (EWD), and an electroluminescent display device (ELDD), or an organic light emitting display device (OLED) and the like.

The organic light emitting display device (OLED) includes a plurality of pixel areas arranged in a display area on which an image is displayed, and a plurality of organic light-emissive elements respectively corresponding to the plurality of pixel areas. Each organic light-emissive element is a self-light-emissive element that emits light. Thus, the organic light emitting display device has a faster response speed, higher luminous efficiency and luminance, a larger viewing angle, and excellent contrast ratio and color reproduction range, compared to the liquid crystal display device.

An organic light-emissive element includes an organic material that can be easily degraded by moisture and oxygen. Accordingly, in order to prevent the organic material from being exposed to moisture and oxygen, etc. and to delay the deterioration of the organic material, the organic light emitting display device has an encapsulation film for sealing the plurality of organic light-emissive elements and an encapsulation substrate on the encapsulation film.

A small-sized panel used in mobile and portable devices has a small panel area, so that heat is rapidly dissipated from the device and there is little problem of adhesion. However, in large-sized panels used in monitors, tablets, and television sets, the panel area is large, such that an encapsulation structure is required for optimal heat dissipation and adhesion.

FIG. 36 is a view of a display device according to a related art. As shown in FIG. 36, a light emitting array 420 is disposed on a transistor array 410, and an encapsulation substrate 423 is disposed on an array substrate 405 sealed with a sealing material 415. In addition, in order to compensate for the insufficient rigidity, a display device 400 can further include a separate inner plate 430 disposed on the encapsulation substrate 423. The inner plate 430 can be attached to a bottom cover 460 through an adhesive member 435. In this case, it is necessary to secure a space for receiving therein the separate inner plate 430. Due to the weight of the inner plate 430, there is a limit in slimming and weight reduction of the display device 400. In addition, a first vertically spaced area g1 is generated due to an air gap generated between the encapsulation substrate 423 and the inner plate 430 by a thickness of an adhesive tape 425 disposed to adhere the encapsulation substrate 423 and the inner plate 430 to each other, thereby reducing the heat dissipation performance.

In addition, as a printed circuit board 440, a flexible circuit board 445 and integrated circuit chip 450 are attached to one side of a top face of the encapsulation substrate 423, and the inner plate 430 is disposed at a position spaced apart by a predetermined spacing from the printed circuit board 440. Thus, the inner plate 430 is not attached to a portion of the top face of the encapsulation substrate 423 where the printed circuit board 440, a flexible circuit board 445 and integrated circuit chip 450 are disposed. Accordingly, there is a problem in that heat is not dissipated in a horizontally spaced area g3 and a second vertically spaced area g2 where the inner plate 430 is not attached as much as an area where the printed circuit board 440, a flexible circuit board 445 and integrated circuit chip 450 are disposed.

SUMMARY

A purpose of the present disclosure is to provide a display device including a sealing structure that can allow suppression of the process defect while having a thickness at which the sealing structure can fix a relatively thicker reinforcing substrate while excluding a separate inner plate.

In addition, the present disclosure aims to improve rigidity and heat dissipation effect by introducing a sealing structure of a multilayer structure that enables to provide a reinforcing substrate having a relatively larger thickness thereabove.

In addition, the present disclosure aims to prevent occurrence of defects on a front surface of the panel by suppressing penetration of moisture in a lateral direction and a front direction of an array substrate.

Further, the present disclosure aims to introduce a sealing structure having a multilayer structure to reduce a warpage amount by which a display device is bent.

In addition, the present disclosure aims to provide a display device in which an internal configuration of the display device can be simplified by introducing a sealing structure of a multilayer structure to secure the rigidity of the display device and to exclude the inner plate, such that the display device is slimmer and lighter than an existing display device.

In addition, the present disclosure aims to implement a narrowed bezel area in the non-display area while preventing a flexible printed circuit board for driving a panel from being damaged even though a sealing structure of a multilayer structure is introduced.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

An example of the present disclosure provides a display device including an array substrate having a display area and a non-display area positioned outside the display area, and having a light-emitting array including a plurality of light emitting elements corresponding to a plurality of pixel areas on the display area; and a sealing structure disposed on the array substrate, wherein the sealing structure seals the light-emitting array, and fixes a plate-shaped reinforcing substrate facing toward the sealing structure to the array substrate. In this connection, the sealing structure includes a first adhesive layer facing toward the array substrate, a second adhesive layer facing toward the reinforcing substrate, and a barrier layer disposed between the first adhesive layer and the second adhesive layer. For example, the sealing structure has a stack structure of the first and second adhesive layers spaced from each other via the barrier layer. In addition, the sealing structure can be configured to further include a protective structure facing toward the reinforcing substrate while being disposed on the second adhesive layer.

Accordingly, the sealing structure can be provided to have a thickness greater than a critical thickness to prevent the process defect in a single layer made of an adhesive material. Due to this sealing structure, a decrease in reliability for fixing the reinforcing substrate having a relatively larger thickness can be prevented. Thus, the rigidity and the heat dissipation effect due to the reinforcing substrate can be sufficiently secured.

Therefore, a separate inner plate can be excluded. This can be advantageous for slimming and lightening of the display device. The deterioration of the heat dissipation effect due to a space between the encapsulation substrate and the inner plate can be prevented.

Because the first adhesive layer of the sealing structure is in contact with the array substrate, only the first adhesive layer can be made of a mixture including inorganic fillers. Thus, a cost of preparing the sealing structure can be reduced. Further, as the second adhesive layer does not include the inorganic filler, a content of the polymer material having adhesiveness included in the second adhesive layer can increase. Thus, the adhesiveness of the second adhesive layer can be relatively higher. As a result, the reinforcing substrate can be more rigidly attached to the sealing structure.

In addition, the second adhesive layer is made of a mixture containing a polymer material that does not contain a carboxyl group, such that corrosion of the barrier layer or deterioration of film uniformity can be prevented, thereby preventing occurrence of defects in the display device.

In addition, because the reinforcing substrate is spaced farther from a pad of the array substrate than the sealing structure is, a flexible circuit board connected to the pad of the array substrate can be prevented from contacting the reinforcing substrate. Accordingly, a damage to the flexible circuit board can be reduced or prevented.

Another example of the present disclosure provides a display device including an array substrate having a display area and a non-display area positioned outside the display area, and having a light-emitting array including a plurality of light emitting elements corresponding to a plurality of pixel areas on the display area; and a sealing structure disposed on the array substrate, wherein the sealing structure seals the light-emitting array, and has a multilayer structure and fixing a plate-shaped reinforcing substrate facing toward the sealing structure to the array substrate. In this connection, the sealing structure includes a first adhesive layer facing toward the array substrate, a second adhesive layer facing toward a protective structure, a barrier layer disposed between the first adhesive layer and the second adhesive layer, and the protective structure disposed between the reinforcing substrate and the second adhesive layer.

In addition, a protective layer of the protective structure can have a thickness at which the protective layer can prevent damage due to bending while blocking external impact, such that rigidity of the display device can be further secured.

Moreover, another example of the present disclosure provides a method for manufacturing a display device, the method including providing an array substrate having a light-emitting array including a plurality of light-emissive elements respectively corresponding to a plurality of pixel areas; providing a sealing structure, wherein the sealing structure includes first and second adhesive layers opposite to each other, and a barrier layer disposed between the first and second adhesive layers; and disposing the sealing structure on the array substrate such that the light-emitting array is sealed with the first adhesive layer.

According to one embodiment of the present disclosure, the sealing structure for bonding the array substrate and the reinforcing substrate to each other and for sealing the light-emitting array of the array substrate has the stack structure of the first and second adhesive layers separated via the barrier layer. Accordingly, the sealing structure can be provided to have a thickness that is about twice as large as a critical value at which the process defect is prevented in a single layer made of an adhesive material. That is, the sealing structure can be prepared to have a relatively larger thickness while preventing the process defects.

As a result, a relatively thicker reinforcing substrate can be prepared. Thus, the rigidity and the heat dissipation effect due to the reinforcing substrate can be sufficiently secured.

Therefore, a separate inner plate for securing the rigidity can be excluded. This can be advantageous for slimming and lightening of the display device. The assembly process of the display device can be simplified. Further, the deterioration of the heat dissipation effect due to a space between the inner plate and the encapsulation substrate can be prevented.

In addition, the sealing structure may further include a protective structure for further securing the rigidity of the display device, thereby preventing damage to the light emitting array of the array substrate even when an external impact is applied to the display device.

In addition, a protective layer of the protective structure can have a thickness at which the protective layer can prevent damage due to bending while blocking external impact to further secure the rigidity of the display device. Thus, even when external impact is applied to the device during an attachment process, the protective layer can prevent damage to the sealing structure and further the damage to the light emitting array of the array substrate.

In addition, implementing the sealing structure as the multi-layer structure can allow reducing the warpage amount by which the display device is bent.

In addition, the heat can be effectively dissipated by using a material with high thermal conductivity as a material of the reinforcing substrate, thereby reducing occurrence of after-images on the panel and improving the lifespan of the light emitting array.

In addition, controlling the thickness and the width of the reinforcing substrate can disallow the flexible printed circuit board to come into contact with the sealing structure or the reinforcing substrate, thereby preventing damage to the flexible printed circuit board.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

FIG. 19 is a table showing a maximum temperature and afterimage reduction rate as measured inside a panel based on each type of a metal material.

FIG. 24 is a table showing an amount of warpage of a panel based on change in a thickness of a protective layer.

DETAILED DESCRIPTION OF THE EMBODIMENTS

Figure 1:
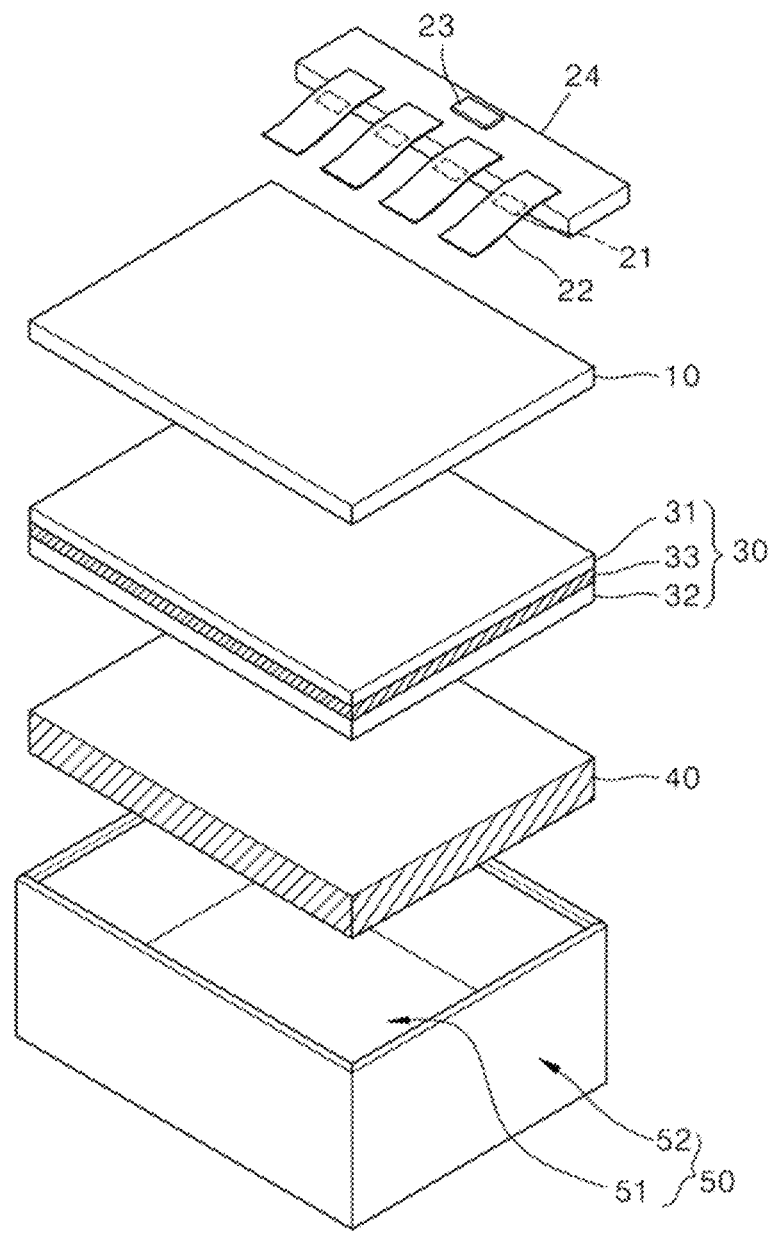
FIG. 1 is an exploded perspective view of a display device according to a first embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

A shape, a size, a ratio, an angle, a number, etc. disclosed in the drawings for describing an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entirety of list of elements and can not modify the individual elements of the list. When referring to "C to D", this means C inclusive to D inclusive unless otherwise specified.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element can be disposed directly on or beneath the second element or can be disposed indirectly on or beneath the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer or multiple layers/elements, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment can be implemented differently, a function or operation specified in a specific block can occur in a sequence different from that specified in a flowchart. For example, two consecutive blocks can actually be executed at the same time. Depending on a related function or operation, the blocks can be executed in a reverse sequence.

In descriptions of temporal relationships, for example, temporal precedent relationships between two events such as "after", "subsequent to", "before", etc., another event can occur therebetween unless "directly after", "directly subsequent" or "directly before" is not indicated. The features of the various embodiments of the present disclosure can be partially or entirely combined with each other, and can be technically associated with each other or operate with each other. The embodiments can be implemented independently of each other and can be implemented together in an association relationship. Spatially relative terms, such as "beneath," "below," "lower," "under," "above," "upper," and the like, can be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" can encompass both an orientation of above and below. The device can be otherwise oriented for example, rotated 90 degrees or at other orientations, and the spatially relative descriptors used herein should be interpreted accordingly.

Further, "a direction", "b direction" and "c direction" should not be interpreted only to have a geometric relationship in which the a direction, the b direction, and the c direction are perpendicular to each other. Thus "a direction", "b direction" and "c direction" can be interpreted to have a broader direction within a range in which components herein can work functionally.

Hereinafter, a display device according to each of embodiments of the present disclosure will be described with reference to the attached drawing. All components of each display device according to all embodiments of the present disclosure are operatively coupled and configured.

FIG. 1 is an exploded perspective view of a display device according to a first embodiment of the present disclosure.

As shown in FIG. 1, a display device according to the first embodiment of the present disclosure includes an array substrate 10, and a sealing structure 30 disposed on the array substrate 10, while other components may not be shown expressly.

The array substrate 10 includes a pad disposed on at least one side edge thereof. At least one flexible circuit board 22 on which an integrated circuit chip 21 for driving a data line (DL of FIG. 2) is mounted can be connected to the pad disposed on at least one side edge of the array substrate 10.

Moreover, the at least one flexible circuit board 22 is further connected to a printed circuit board 24 on which an integrated circuit chip 23 that controls an operation timing of the array substrate 10 is mounted. For example, the at least one flexible circuit board 22 is disposed between the array substrate 10 and the printed circuit board 24. It should be noted the at least one flexible circuit board 22 and the printed circuit board 24 are shown on top of the array substrate 10 in FIG. 1 for clearly showing these circuit boards, but the at least one flexible circuit board 22 and the printed circuit board 24 are disposed on the reinforcing substrate 40 in a real display device, as shown in the following figures.

The sealing structure 30 can fix the plate-shaped reinforcing substrate 40 facing toward the sealing structure 30 to the array substrate 10.

The sealing structure 30 can include a first adhesive layer 31 facing toward the array substrate 10, a second adhesive layer 32 facing toward the reinforcing substrate 40, and a barrier layer 33 disposed between the first adhesive layer 31 and the second adhesive layer 32, among others. Each of the first and second adhesive layers 31 and 32 can include an adhesive material, such as a polymer material having adhesiveness. The barrier layer 33 is thinner than each of the first and second adhesive layers 31 and 32, but such is not required. For example, the sealing structure 30 includes the first and second adhesive layers 31 and 32 separated via the barrier layer 33 in a form of a thin-film. Therefore, the sealing structure 30 can have a relatively thick thickness while preventing a process defect of an adhesive material depending on the thickness thereof. The thickness of the barrier layer 33 relative to those of the first and second adhesive layers 31 and 32 can vary. For example, the barrier layer 33 can have a greater thickness than that of the first adhesive layer 31, the second adhesive layer 32, or both. As the thickness of the barrier layer 33 can vary, the thickness of the barrier layer 33 can be greater than that of the first adhesive layer 31, but less than that of the second adhesive layer 32, or vice versa.

Specifically, when a relatively thick single adhesive material layer is present, the process defect such as a thickness unevenness due to insertion of a foreign material into the layer and displacement of the layer can occur frequently and easily. Accordingly, the single adhesive material layer needs to have a thickness smaller than a critical thickness to prevent the process defect.

To the contrary, the sealing structure 30 of the display device according to the first embodiment of the present disclosure is not composed of a single layer made of the adhesive material, but is composed of the first and second adhesive layers 31 and 32 separated via the thin barrier layer 33. Therefore, the sealing structure 30 can have a thickness of about twice of a critical thickness of a single adhesive layer to prevent the process defect, but can alternatively have a thickness that is greater than the critical thickness of the single adhesive layer but less than twice the critical thickness. In some other embodiments, the thickness of the sealing structure 30 can be greater than twice the critical thickness of a single adhesive layer based on heat dissipation and rigidity needs.

In addition, as the thickness of the sealing structure 30 is increased, a critical thickness of the reinforcing substrate 40 that can be fixed to the array substrate 10 via the sealing structure 30 can be increased. Thus, the rigidity and the heat dissipation effect due to the reinforcing substrate 40 can be improved. Therefore, a separate inner plate can be unnecessary, and slimming and lightening of the display device can be reliably achieved. Further, the deterioration of the heat dissipation effect can be prevented or effectively reduced.

Further, the display device according to the first embodiment of the present disclosure can further include the reinforcing substrate 40 fixed onto the array substrate 10 by the sealing structure 30.

Further, the display device according to the first embodiment of the present disclosure can further include a bottom cover 50 housing the array substrate 10, the sealing structure 30 and the reinforcing substrate 40.

The bottom cover 50 includes a bottom portion 51 facing toward the reinforcing substrate 40. Alternatively, the bottom cover 50 can further include a side portion 52 vertically extending from an outer periphery of the bottom portion 51 toward the array substrate 10. Additional layers or structures enabling improved heat dissipation and/or rigidity can be included.

Figure 2:
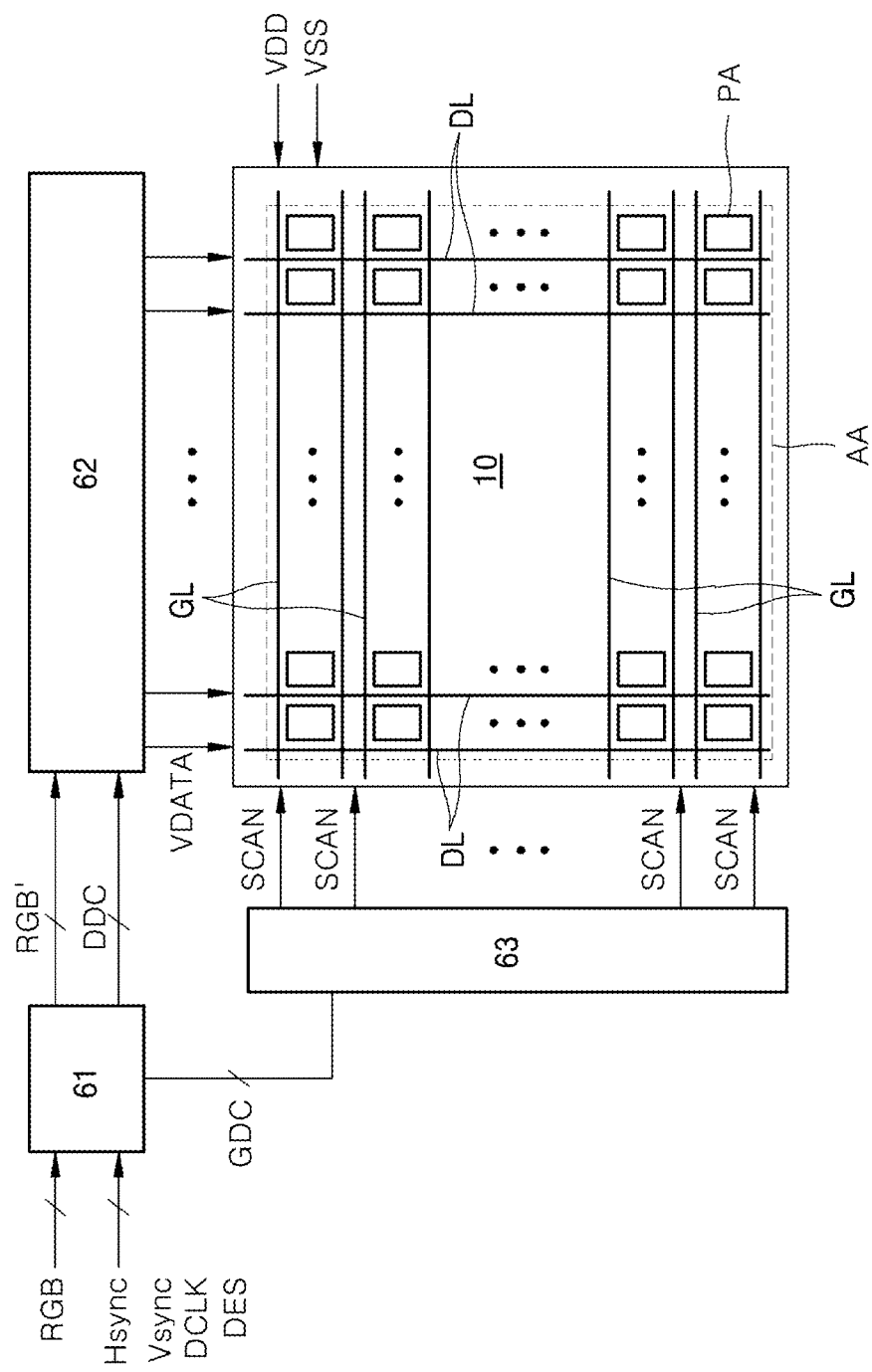
FIG. 2 is a block diagram corresponding to an array substrate and an integrated circuit chip in FIG. 1.
Figure 3:
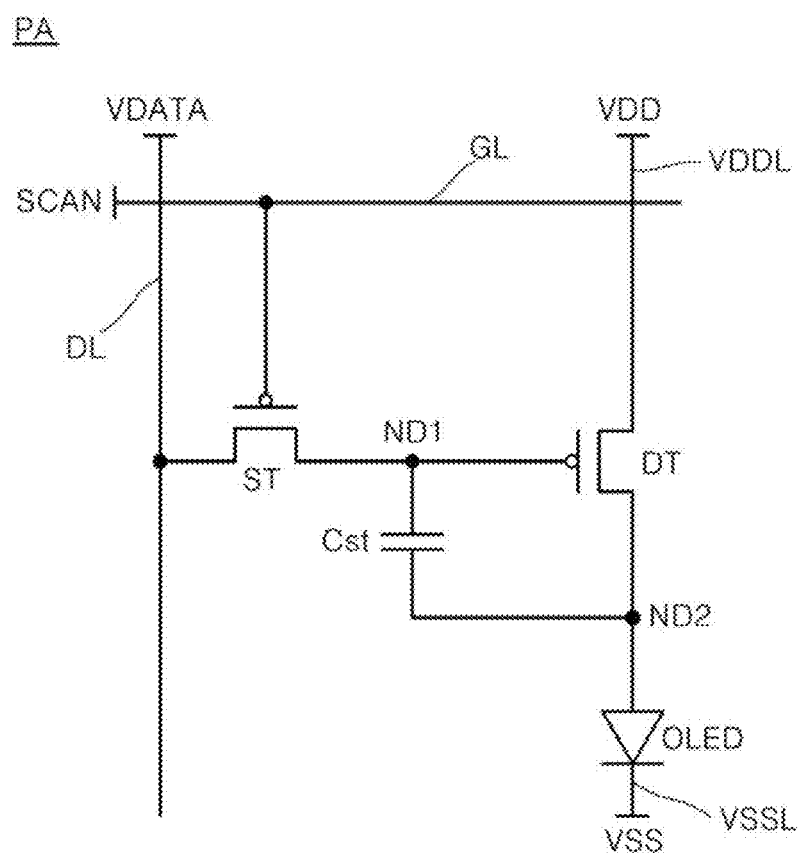
FIG. 3 is a diagram showing an example of an equivalent circuit corresponding to a pixel area of FIG. 2.
Figure 4:
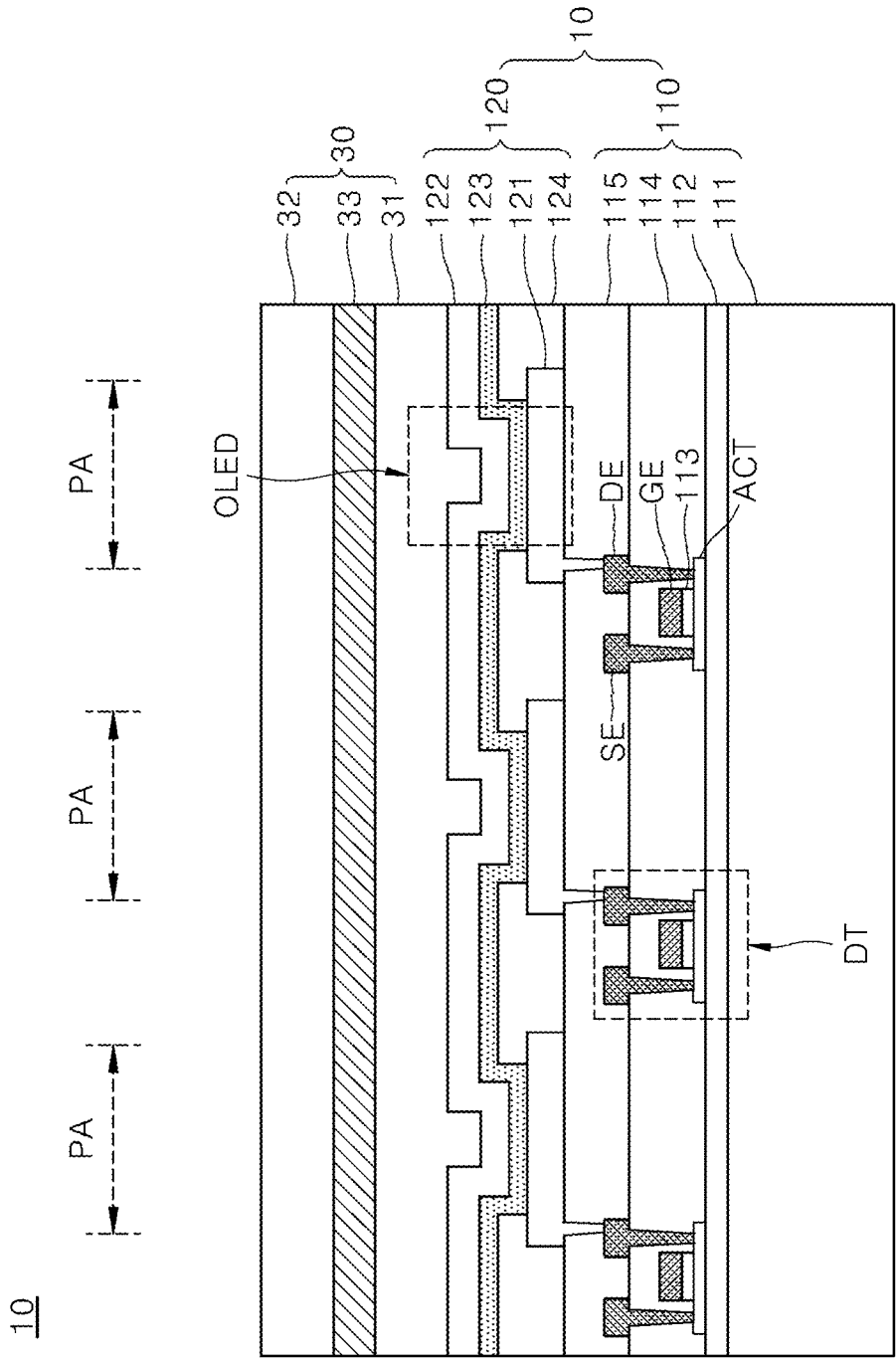
FIG. 4 is a view showing an example of a driving thin-film transistor and an organic light-emissive element of FIG. 3.

FIG. 2 is a block diagram corresponding to the array substrate and the integrated circuit chip in FIG. 1. FIG. 3 is a diagram showing an example of an equivalent circuit corresponding to the pixel area of FIG. 2. FIG. 4 is a view showing an example of a driving thin-film transistor and an organic light-emissive element of FIG. 3.

As shown in FIG. 2, the display device according to the first embodiment of the present disclosure includes the array substrate 10 including a display area AA (active area) on which an image is displayed, and drivers 61, 62 and 63 that respectively supply signals to signal lines GL and DL of the array substrate 10. Some of the drivers 61, 62, and 63 can be embodied as an integrated circuit chip 21 mounted on the at least one flexible circuit board 22 connected to the array substrate 10, and an integrated circuit chip 23 mounted on the printed circuit board 24 connected to the at least one flexible circuit board 22. Moreover, the other of the drivers 61, 62, and 63 can be embedded in the array substrate 10. The display device can include additional elements and structures, and the elements shown in FIG. 2 is by way of example to provide one example of a display device usable with the sealing structure 30.

The array substrate 10 can include a plurality of pixel areas PA defined in the display area AA, while the drivers 61, 62 and 63 can be provided in a peripheral area or a non-active area (or a non-display area).

Each of the plurality of pixel areas PA refers to an area for emitting light corresponding to one color. Two or more pixel areas PA adjacent to each other among the plurality of pixel areas PA and corresponding to different colors can constitute a unit pixel for emitting light of various colors. For example, one unit pixel can be realized. The unit pixel can display various colors by combining light beams respectively emitting from two or more pixel areas PA adjacent to each other.

The array substrate 10 can include a gate line GL that supplies a scan signal SCAN for selecting a horizontal line to which a data signal VDATA is to be written, and a data line DL that supplies a data signal VDATA. The horizontal line can be composed of pixel areas arranged in a line in a horizontal direction among the plurality of pixel areas PA.

In addition, the array substrate 10 can further include first and second driving power lines (VDDL and VSSL in FIG. 3) that respectively supply first and second driving powers VDD and VSS for operation of the light-emissive element.

The drivers include a timing controller 61, a data driver 62 connected to the data line DL, and a gate driver 63 connected to the gate line GL.

The timing controller 61 rearranges digital video data RGB input from an external system based on a resolution of the array substrate 100, and supplies the rearranged digital video data RGB' to the data driver 62.

The timing controller 61 can generate and supply a data control signal DDC to control an operation timing of the data driver 62, and a gate control signal GDC to control an operation timing of the gate driver 63, based on timing signals such as a vertical synchronization signal Vsync, a horizontal synchronization signal Hsync, a dot clock signal DCLK, and a data enable signal DES.

The gate driver 63 sequentially supplies a scan signal SCAN to a plurality of gate lines GLs during one frame period for displaying an image based on the gate control signal GDC.

For example, the gate driver 63 supplies a scan signal SCAN to each gate line GL during each horizontal period corresponding to each gate line GL during one frame period.

The data driver 62 converts the rearranged digital video data RGB' into an analog data voltage based on the data control signal DDC. The data driver 62 supplies, to the data line DL, a data signal VDATA corresponding to each of the pixel areas PA of the horizontal line to which the scan signal SCAN is supplied during each horizontal period, based on the rearranged digital video data RGB'.

As shown in FIG. 3, each pixel area PA can include an organic light-emissive element OLED, and a pixel circuit for supplying a drive signal to the organic light-emissive element OLED. Additional elements or structure can be included based on type of displays.

In one example, the pixel circuit can include a driving transistor DT, a switching transistor ST, and a storage capacitor Cst. This is merely one example. Each area PA can further include a compensation circuit for compensating for deterioration of at least one of the driving transistor DT and the light-emissive element OLED. The compensation circuit can include at least one transistor to detect a deterioration amount or to supply a reference power.

The organic light-emissive element OLED can include first and second electrodes, for example, an anode and a cathode, and a light-emitting layer disposed between the first and second electrodes. The light-emitting layer emits light based on the drive current between the first and second electrodes. The organic light-emissive element OLED can have a multi-stack structure including two or more light-emitting layers.

The driving transistor DT can be connected in series to the light-emissive element OLED and can be disposed between a first driving power line VDDL supplying a first driving power VDD and a second driving power line VSSL supplying a second driving power VSS with a lower potential than that of the first driving power VDD.

The switching transistor ST is disposed between a first node ND1 and the data line DL supplying the data signal VDATA of each pixel area PA. The first node ND1 is a contact point between a gate electrode of the driving transistor DT and the switching transistor ST. Moreover, a gate electrode of the switching transistor ST is connected to the gate line GL.

The storage capacitor Cst is disposed between the first node ND1 and a second node ND2. The second node ND2 is a contact point between the driving transistor DT and the organic light-emissive element OLED.

An operation of this pixel circuit is as follows. The switching transistor ST is turned on based on the scan signal SCAN of the gate line GL. In this connection, the data signal VDATA of the data line DL is supplied to the gate electrode of the driving transistor DT and the storage capacitor Cst via the turned-on switching transistor ST and the first node ND1.

The storage capacitor Cst is charged with the data signal VDATA supplied to the first node ND1.

Moreover, the driving transistor DT is turned on based on the data signal VDATA supplied to the first node ND1, and the charged voltage of the storage capacitor Cst to generate a drive current corresponding to the data signal VDATA. Accordingly, the drive current resulting from the turned-on driving transistor DT can be supplied to the second node ND2, for example, to the organic light-emissive element OLED.

As shown in FIG. 4, the array substrate 10 can include a transistor array 110 including a plurality of pixel circuits respectively corresponding to a plurality of pixel areas PA, and a light-emitting array 120 including a plurality of organic light-emissive elements OLED respectively corresponding to the plurality of pixel areas PA. Additional elements or structure can be included based on a type of display.

The transistor array 110 can include a base substrate 111 including a display area AA corresponding to the plurality of pixel areas PAs, and a driving thin-film transistor DT disposed on the base substrate 111 and corresponding to each pixel area PA. Moreover, the transistor array 110 can further include a planarization film 115 that covers the driving thin-film transistor DT in a planarized manner.

The base substrate 111 can be made of an insulating material and can be flat. In one example, the base substrate 111 can be made of glass or plastic. Additional choice of material for the base substrate 111 is possible, based on at least the structural need of the display device.

The driving thin-film transistor DT can include an active layer ACT disposed on a buffer film 112 covering the base substrate 111, a gate insulating layer 113 disposed on a channel area of the active layer ACT, a gate electrode GE disposed on the gate insulating layer 113, an interlayer insulating film 114 covering the buffer film 112, the active layer ACT and the gate electrode GE, a source electrode SE disposed on the interlayer insulating film 114 and connected to a source area of the active layer ACT, and a drain electrode DE disposed on the interlayer insulating film 114 and connected to a drain area of the active layer ACT.

The buffer film 112 can be made of an insulating material that can be easily to adhere to the active layer ACT, such as silicon nitride $SiN_x$ and silicon oxide $SiO_2$. The buffer film 112 can not only help fix the active layer ACT, but also block invasion of moisture or oxygen through the base substrate 111 and prevent defects of the base substrate 111 from transferring to the interlayer insulating films 114 and the planarization film 115 on the base substrate 111. However, depending on the material of the base substrate 111, the buffer film 112 can be omitted from the transistor array 110, or can have a different configuration.

The active layer ACT can be made of a silicon semiconductor or an oxide semiconductor. Additional choice of material for the active layer ACT is possible, based on at least the performance need of the display device.

In addition, in FIG. 4, the transistor array 110 can further include the switching thin-film transistor (ST in FIG. 3), the gate line connected to the gate electrode (GL in FIG. 3) of the switching thin-film transistor ST, and the data line (DL in FIG. 3) connected to one of the source electrode and the drain electrode of the switching thin-film transistor ST.

The gate line GL can be disposed on the gate insulating film 113 as the gate electrode GE of the driving thin-film transistor DT can be disposed on the gate insulating film 113.

The data line DL can be disposed on the interlayer insulating film 114 as the source electrode SE and the drain electrode DE of the driving thin-film transistor DT can be disposed on the interlayer insulating film 114.

The interlayer insulating film 114 is disposed on the buffer film 112 and covers the active layer ACT and the gate electrode GE in a planarized manner. The interlayer insulating film 114 can have a structure in which layers made of at least one insulating material selected among organic insulating materials and inorganic insulating materials are stacked vertically. Examples of the inorganic insulating material include silicon nitride $SiN_x$ and silicon oxide $SiO_2$.

Examples of organic insulating materials include acryl resin, epoxy resin, phenolic resin, polyamide resin, and polyimide resin.

Like the interlayer insulating film 114, the planarization film 115 can have a structure in which layers made of at least one insulating material selected among organic insulating materials and inorganic insulating materials are stacked vertically.

The light-emitting array 120 can be disposed on the planarization film 115 of the transistor array 110, and can include the plurality of organic light-emissive elements OLED respectively corresponding to the plurality of pixel areas PA.

Each organic light-emissive element OLED can include opposing first and second electrodes 121 and 122, and a light-emitting layer 123 disposed between the first and second electrodes 121 and 122.

The light-emitting array 120 can include a plurality of the first electrodes 121 respectively corresponding to the plurality of pixel areas PA and disposed on the transistor array 110, a bank 124 disposed on the transistor array 110, and disposed out of each pixel area PA, and covering an edge of the first electrode 121, the light-emitting layer 123 disposed on the bank 124 and the first electrode 121, and the second electrode 122 disposed on the light-emitting layer 123 and corresponding to the plurality of pixel areas PA.

The sealing structure 30 can be disposed on the array substrate 10 and can cover the light-emitting array 120. The sealing structure 30 can have a structure in which films of different thickness and materials are stacked. A portion of the sealing structure 30 can be made of a material having adhesiveness. Additional choice of materials or layers for the sealing structure 30 is possible, based on at least the structural need of the display device, or other needs.

The first adhesive layer 31 of the sealing structure 30 can cover the light-emitting array 120 in a planarized manner and can seal the light-emitting array 120.

Figure 5:
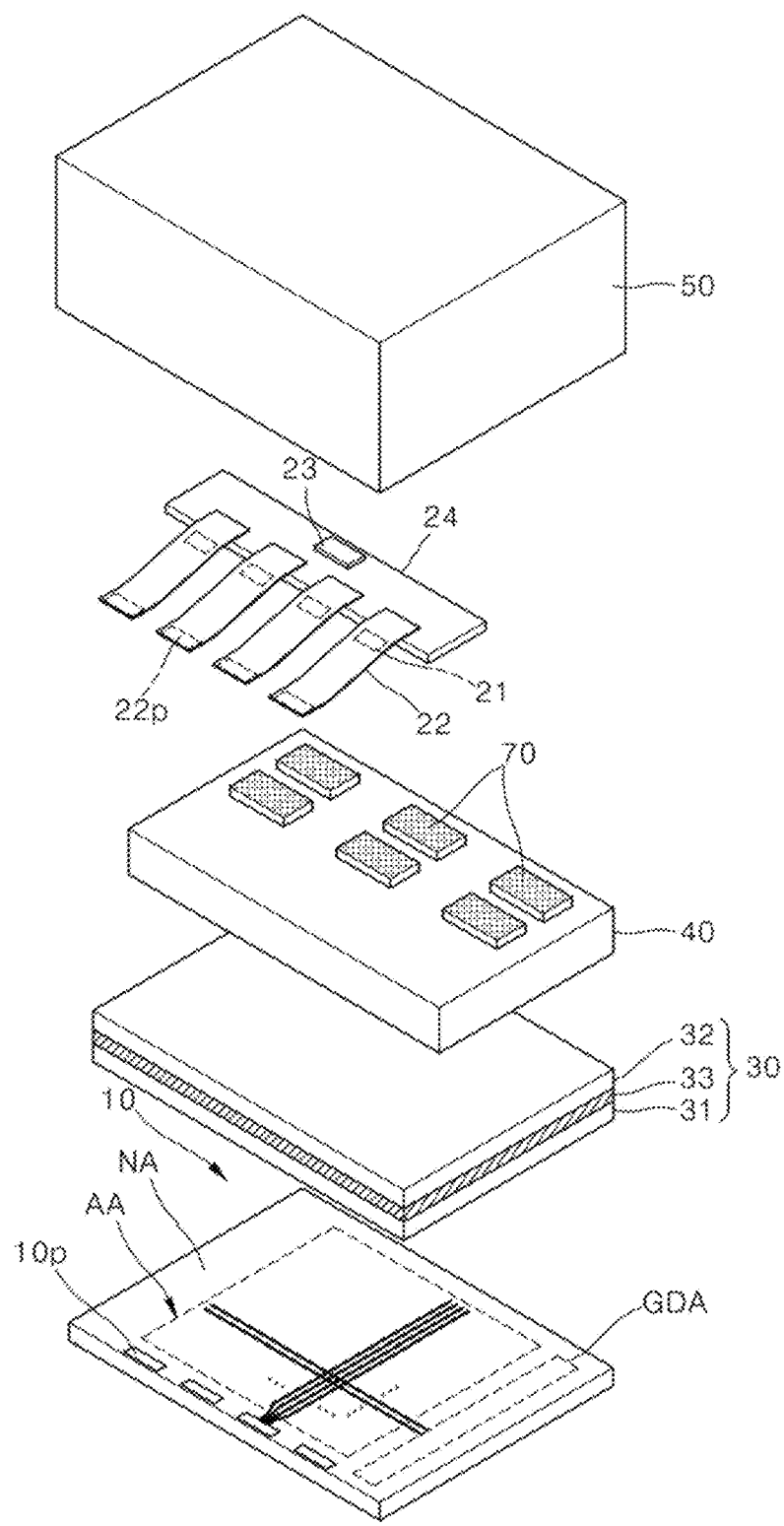
FIG. 5 is a view showing an array substrate, a sealing structure, a reinforcing substrate, a flexible circuit board and a printed circuit board of FIG. 1 in an exploded manner.

FIG. 5 is a view showing the array substrate, the sealing structure, the reinforcing substrate, the flexible circuit board and the printed circuit board of FIG. 1 in an exploded manner.

As shown in FIG. 5, the gate driver (63 in FIG. 2) that supplies the scan signal SCAN to the gate line GL can be embedded in the array substrate 10.

In one example, the gate driver (63 in FIG. 2) can be disposed in a partial area GDA (gate driver area) disposed adjacent to one side edge of the display area AA in a non-display area NA outside of the display area AA. In this connection, the non-display area NA can also be referred to as a bezel area.

The data driver (62 in FIG. 2) for supplying the data signal VDATA to the data line DL can be embodied as the integrated circuit chip 21 mounted on the flexible circuit board 22.

The flexible circuit board 22 on which the integrated circuit chip 21 is mounted can be connected to and disposed between one side edge of the array substrate 10 and the printed circuit board 24.

The timing controller (61 of FIG. 2) can be embodied as the integrated circuit chip 23 mounted on the printed circuit board 24.

The array substrate 10 can further include a pad 10P disposed adjacent to the opposite edge of the display area AA in the non-display area NA.

The flexible circuit board 22 on which the integrated circuit chip 21 of the data driver (62 of FIG. 2) is mounted can include a pad 22p disposed on one side thereof. When the pad 22p of the flexible circuit board 22 is bonded to the pad 10p of the array substrate 10, the array substrate 10 and the flexible circuit board 22 can be electrically connected to each other.

Figure 6:
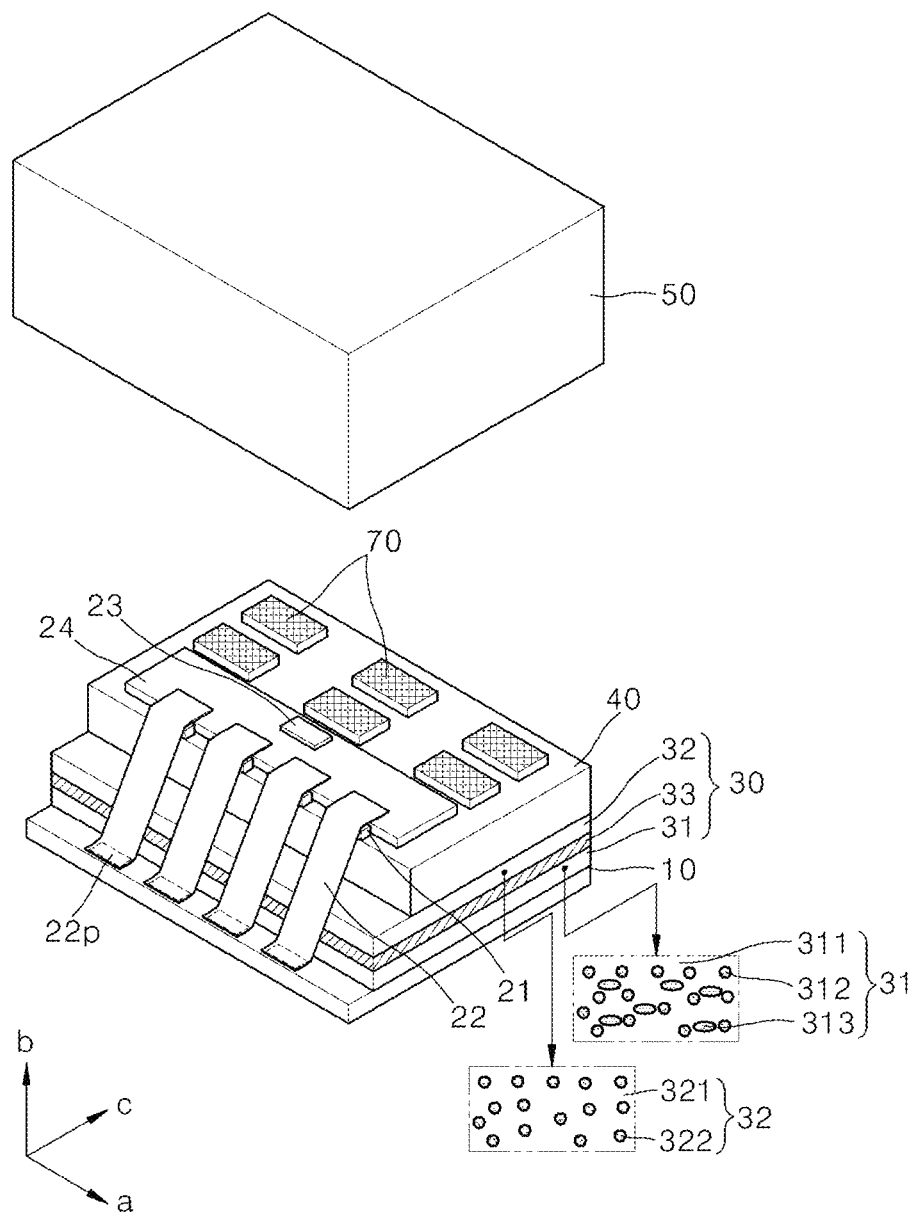
FIG. 6 is a view showing an arrangement example of an array substrate, a sealing structure, a reinforcing substrate, a flexible circuit board, and a printed circuit board of FIG. 1.
Figure 7:
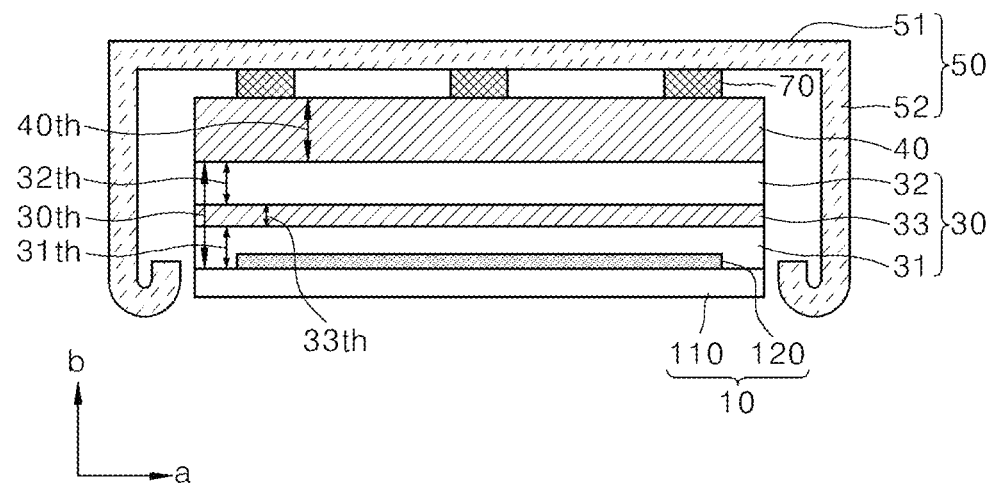
FIG. 7 is a view showing an example of an ab plane cross-section of FIG. 6.
Figure 8:
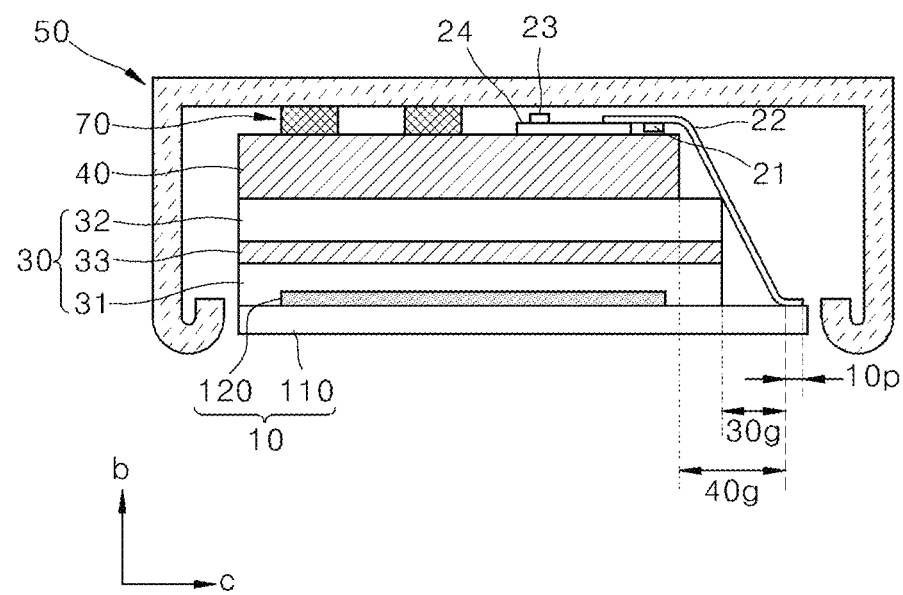
FIG. 8 is a view showing an example of a cb plane cross-section of FIG. 6.

FIG. 6 is a view showing an arrangement example of the array substrate, the sealing structure, the reinforcing substrate, the flexible circuit board, and the printed circuit board of FIG. 1. FIG. 7 is a view showing an example of an a-b plane cross-section of FIG. 6. FIG. 8 is a view showing an example of a c-b plane cross-section of FIG. 6.

As shown in FIG. 6 and FIG. 7, a display device according to the first embodiment of the present disclosure can include the array substrate 10 having the light-emitting array (120 in FIG. 4) including the plurality of light-emissive elements (OLEDs of FIG. 4) respectively corresponding to the plurality of pixel areas (PA in FIG. 4), and the sealing structure 30 disposed on the array substrate 10, wherein the sealing structure seals the light-emitting array 120, and fixes the plate-shaped reinforcing substrate 40 facing toward the sealing structure 30 to the array substrate 10.

The sealing structure 30 can include the first adhesive layer 31 facing toward the array substrate 10, the second adhesive layer 32 facing toward the reinforcing substrate 40, and the barrier layer 33 disposed between the first adhesive layer 31 and the second adhesive layer 32.

Each of the first adhesive layer 31 and the second adhesive layer 32 is made of a polymer material having adhesiveness.

In one example, the first adhesive layer 31 can be made of a first polymer material 311 of one of an olefin-based polymer, an epoxy-based polymer, and an acrylate based polymer. Further, the second adhesive layer 32 can be made of a second polymer material 321 of one of olefin-based, epoxy-based, acrylate-based, amine-based, phenol-based and acid anhydride-based polymers, and that each of which do not contain a carboxyl group. In particular, the second adhesive layer 32 is preferably made of the second polymer material 321 that does not contain the carboxyl group for film uniformity and corrosion prevention of the barrier layer 33 to be described later. Additional choice of material for the first and second adhesive layers 31 and 32 are possible, based on heat dissipation and rigidity need for the display device.

For heat dissipation of the array substrate 10, at least the first adhesive layer 31 among the first and second adhesive layers 31 and 32 can be made of a mixture including the first polymer material 311 having the adhesiveness and first particles 312 made of a metal material. In one example, the first particles 312 made of the metal material can be powders made of Ni, among other metals or materials. The particles 312 can be arranged to contact one or more of other particles 312, or the polymer material 331, and such an arrangement can be a chain or a series of connected particles 312 and 331.

For example, the first adhesive layer 31 in direct contact with the array substrate 10 can be made of the mixture including the first polymer material 311 having the adhesiveness and the first particles 312, and thus can have higher thermal conductivity than that of an adhesiveness polymer material, among various materials.

Similarly, according to the first embodiment of the present disclosure, the second adhesive layer 32 can be made of a mixture including the second polymer material 321 having the adhesiveness and the second particles 322, and thus can have higher thermal conductivity than that of the adhesiveness polymer material.

In this way, a rate at which the heat generated from the array substrate 10 is dissipated through the sealing structure 30 can be improved, such that the heat dissipation effect from the array substrate 10 can be improved.

Further, in order to prevent or at least reduce moisture permeation into the light-emitting array 120 of the array substrate 10, the first adhesive layer 31 can be composed of a mixture further including hygroscopic inorganic fillers 313. The hygroscopic inorganic filler 313 can be made of at least one of CaO, MgO, and BaO, among various materials.

Unlike the first adhesive layer 31, the second adhesive layer 32 does not come in contact with the light-emitting array 120. Thus, there is no need for the second adhesive layer 32 to include the hygroscopic inorganic filler for preventing moisture permeation into the light-emitting array 120, but such is not required. Accordingly, the second adhesive layer 32 does not include the hygroscopic inorganic filler, but can include only the second polymer material 321 having the adhesiveness and the second particles 322 made of the metal material. In this way, an amount of a relatively expensive hygroscopic inorganic filler injected into the sealing structure 30 can be reduced, so that a cost of preparing the sealing structure 30 can be reduced. Further, as the hygroscopic inorganic filler is not included in the second adhesive layer 32, a mixing percentage of the second polymer material included in the second adhesive layer 32 can be increased, compared to that in the first adhesive layer 31. Thus, the adhesiveness of the second adhesive layer 32 can be higher than that of the first adhesive layer 31. Accordingly, there is an advantage that reliability of fixing the reinforcing substrate 40 can be improved. Accordingly, as the reinforcing substrate 40 is more firmly fixed on the second adhesive layer 32, the reliability of the bonding force between the array substrate 10 and the reinforcing substrate 40 can be further improved. In addition, as a multi-layered structure composed of the first adhesive layer 31 and the second adhesive layer 32 is formed, there is an advantage in that the warpage amount by which the panel is bent can be reduced and thus the reliability can be improved.

In this connection, the array substrate 10 can be referred to as a support substrate, the reinforcing substrate 40 can be referred to as a bonding substrate, and the sealing structure 30 can be referred to as a bonding structure. In addition, the first adhesive layer 31 can be referred to as a sealing adhesive layer, the barrier layer 33 can be referred to as a bonding reinforcing thermal-conductive layer, and the second adhesive layer 32 can be referred to as a bonding reinforcing adhesive layer. Accordingly, the bonding structure can be referred to as being composed of the sealing adhesive layer, the bonding reinforcing thermal conductive layer, and the bonding reinforcing adhesive layer on the support substrate.

Each of thicknesses 31$th$ and 32$th$ of the first and second adhesive layers 31 and 32, respectively can be limited to a value smaller than or equal to a critical value of a single adhesive layer at which a process defect is prevented. Moreover, a sum of the thicknesses 31$th$ and 32$th$ of the first and second adhesive layers 31 and 32 can be limited to a value greater than or equal to a critical value that can secure the reliability for fixing the reinforcing substrate 40.

In one example, each of the thicknesses 31$th$ and 32$th$ of the first and second adhesive layers 31 and 32 can be within a range of 10 μm to 100 μm.

The barrier layer 33 can be made of any one of a metal material and an inorganic insulating material. For example, the barrier layer 33 can include a metal material such as Al, Cu, Sn, Ag, Fe, or Zn, among choice of materials. In another example, the barrier layer 33 can be embodied as a thin film of an inorganic insulating material such as $SiO_x$ and $SiON_x$. Other materials can be used.

The barrier layer 33 can be introduced to reinforce the adhesion with the first and second adhesive layers 31 and 32 and to implement a stack structure for reducing warpage. Specifically, the first adhesive layer 31 and the second adhesive layer 32 can be configured to include adhesive polymer materials 311 and 321, respectively. Accordingly, the barrier layer 33 made of a relatively hard material is disposed between the first adhesive layer 31 and the second adhesive layer 32. Thus, as the first adhesive layer 31 and the second adhesive layer 32 are adhered onto one surface and the other surface of the barrier layer 33, respectively, thereby improving adhesion. Thus, the sealing structure 30 can be implemented as a stack structure in which the first adhesive layer 31, the barrier layer 33 and the second adhesive layer 32 are bonded to each other and are stacked.

The thickness 33$th$ of the barrier layer 33 can be limited to a value greater than or equal to a critical value at which easy occurrence of a hole related defect can be prevented. Moreover, in order to minimize the increase in the thickness of the sealing structure 30 due to the barrier layer 33, the thickness 33$th$ of the barrier layer 33 can be limited to a value smaller than that of each of the first and second adhesive layers 31 and 32.

For example, the thickness 33$th$ of the barrier layer 33 can be within a range greater than 10 μm and smaller than each of the thicknesses 31$th$ and 32$th$ of the first and second adhesive layers 31 and 32.

As such, the sealing structure 30 according to the first embodiment of the present disclosure can include the first and second adhesive layers 31 and 32 separated via the thin barrier layer 33, and thus can have a thickness that is about twice as large as that of a single-layer adhesive material while preventing the process defect.

Accordingly, the reinforcing substrate 40 fixed to the array substrate 10 by the sealing structure 30 can have a larger thickness, such that the rigidity can be increased and the heat dissipation effect can be easily realized.

For example, when the thickness 30$th$ of the sealing structure 30 is within the range of 30 μm to 300 μm, the thickness 40$th$ of the reinforcing substrate 40 can be implemented as a thickness in the range of 0.1 mm to 1.5 mm, approximately.

In one example, the reinforcing substrate 40 can be made of one material selected among glass, metal, and plastic polymer. For example, the reinforcing substrate 40 can be made of a metal material including Al, Cu, Sn, Ag, Fe, or Zn. Other choice of materials can be used.

In addition, the display device can further include the bottom cover 50 housing the array substrate 10, the flexible circuit board 22, the printed circuit board 24, the sealing structure 30, and the reinforcing substrate 40.

The bottom cover 50 can be coupled to the reinforcing substrate 40 via at least one adhesive pattern 70 disposed between the reinforcing substrate 40 and the bottom cover 50.

As shown in FIG. 6 and FIG. 8, the display device further can includes the at least one flexible circuit board 22 connected to the array substrate 10, and the printed circuit board 24 connected to the at least one flexible circuit board 22.

On each flexible circuit board 22, the integrated circuit chip 21 corresponding to the data driver (62 in FIG. 2) that drives the data line DL of the array substrate 10 is mounted.

The integrated circuit chip 23 corresponding to the timing controller (61 in FIG. 2) for controlling the operation timing of each of the data driver (62 in FIG. 2) and the gate driver (63 in FIG. 2) is mounted on the printed circuit board 24.

The printed circuit board 24 is disposed on one face of the reinforcing substrate 40 facing toward the bottom portion 51 of the bottom cover 50.

One side of each flexible circuit board 22 is connected to the pad (10p of FIG. 5) of the array substrate 10, while the opposite side of each flexible circuit board 22 is connected to the pad of the printed circuit board 24.

The printed circuit board 24 is disposed on one face of the reinforcing substrate 40 facing toward the bottom portion 51 of the bottom cover 50, while the reinforcing substrate 40 is fixed to the array substrate 10 via the sealing structure 30. Therefore, the flexible circuit board 22 is disposed across the sealing structure 30 and the reinforcing substrate 40.

In this connection, when the flexible circuit board 22 is in contact with an edge of the reinforcing substrate 40 that can have a hard and somewhat rough surface, collision between the flexible circuit board 22 and the reinforcing substrate 40 can occur repeatedly according to movement of the flexible circuit board 22. Thus, damage to the flexible circuit board 22 is inevitable.

Accordingly, according to the first embodiment of the present disclosure, in order to prevent the flexible circuit board 22 from coming into contact with the reinforcing substrate 40, the reinforcing substrate 40 can have a width smaller than that of the sealing structure 30.

For example, one side edge of the sealing structure 30 adjacent to the pad 10p of the array substrate 10 can be spaced apart from the pad 10p of the array substrate 10 by a first spacing 30g. In this case, one side edge of the reinforcing substrate 40 adjacent to the pad 10p of the array substrate 10 can be spaced apart from the pad 10p of the array substrate 10 by a second spacing 40g greater than the first spacing 30g.

In other words, a side edge of the sealing structure 30 adjacent to the pad 10p of the array substrate 10 can be closer to the pad 10p than a side edge of the reinforcing substrate 40 adjacent to the pad 10p of the array substrate 10 can be, as shown in FIG. 8. Thus, a portion of the sealing structure 30 adjacent to the pad 10p of the array substrate 10 is not covered with the reinforcing substrate 40 and thus is exposed.

Further, the integrated circuit chip 21 mounted on each flexible circuit board 22 can be disposed adjacent to the printed circuit board 24. In one example, the integrated circuit chip 21 mounted on each flexible circuit board 22 can be disposed in an overlapping area between the reinforcing substrate 40 and the flexible circuit board 22.

In this way, the flexible circuit board 22 can be spaced from the reinforcing substrate 40 via the integrated circuit chip 21. Thus, collision between the flexible circuit board 22 and the reinforcing substrate 40 can be reduced.

Accordingly, each flexible circuit board 22 can extend across and over the exposed portion of the sealing structure 30.

In this case, contacts and repeated collisions between each flexible circuit board 22 and the sealing structure 30 are inevitable. However, Because the sealing structure 30 is more flexible than the reinforcing substrate 40, a damage level to the flexible circuit board 22 due to contact thereof with the sealing structure 30 can be lowered, compared to a damage level to the flexible circuit board 22 due to the collision thereof with the reinforcing substrate 40. Accordingly, a decrease in reliability and a decrease in a lifespan of the display device can be prevented. In addition, setting a minimum spacing of the flexible circuit board 22 from the reinforcing substrate 40 such that the damage to the flexible circuit board 22 can be minimized can achieve a narrow bezel effect that can reduce a bezel width of the panel. Further, reducing an area of the surface of the sealing structure 30 that is exposed can improve the bonding force between the reinforcing substrate 40 and the array substrate 10 and the heat dissipation effect.

In addition, as the flexible printed circuit board 22 is disposed on the sealing structure 30 having a relatively thick stack structure and the reinforcing substrate 40, the heat generated from the flexible printed circuit board 22 can be prevented from transferring to the array substrate 10. In other words, the flexible printed circuit board 22 is disposed on a top face of the reinforcing substrate 40 having high thermal conductivity and at the outermost portion of the panel, such that the heat dissipation effect can be increased.

As described above, the display device according to the first embodiment of the present disclosure can include the sealing structure 30 including the first and second adhesive layers 31 and 32 stacked one on top of the other while the barrier layer 33 is interposed therebetween. The sealing structure 30 can have a stack structure of the first and second adhesive layers 31 and 32, and thus can be larger than a single layer made of the adhesive material while preventing the process defect.

Accordingly, the reinforcing substrate 40 can be relatively thicker, such that the rigidity and the heat dissipation effect due to the reinforcing substrate 40 can be improved.

Therefore, the display device does not need to have the separate inner plate to secure the rigidity. This can be advantageous for slimming and lightening of the display device. Further, deterioration of the heat dissipation effect due to a space between the inner plate and the reinforcing substrate 40 can be prevented.

In addition, excluding the inner plate can allow an assembly process of the display device to be facilitated.

Figure 9:
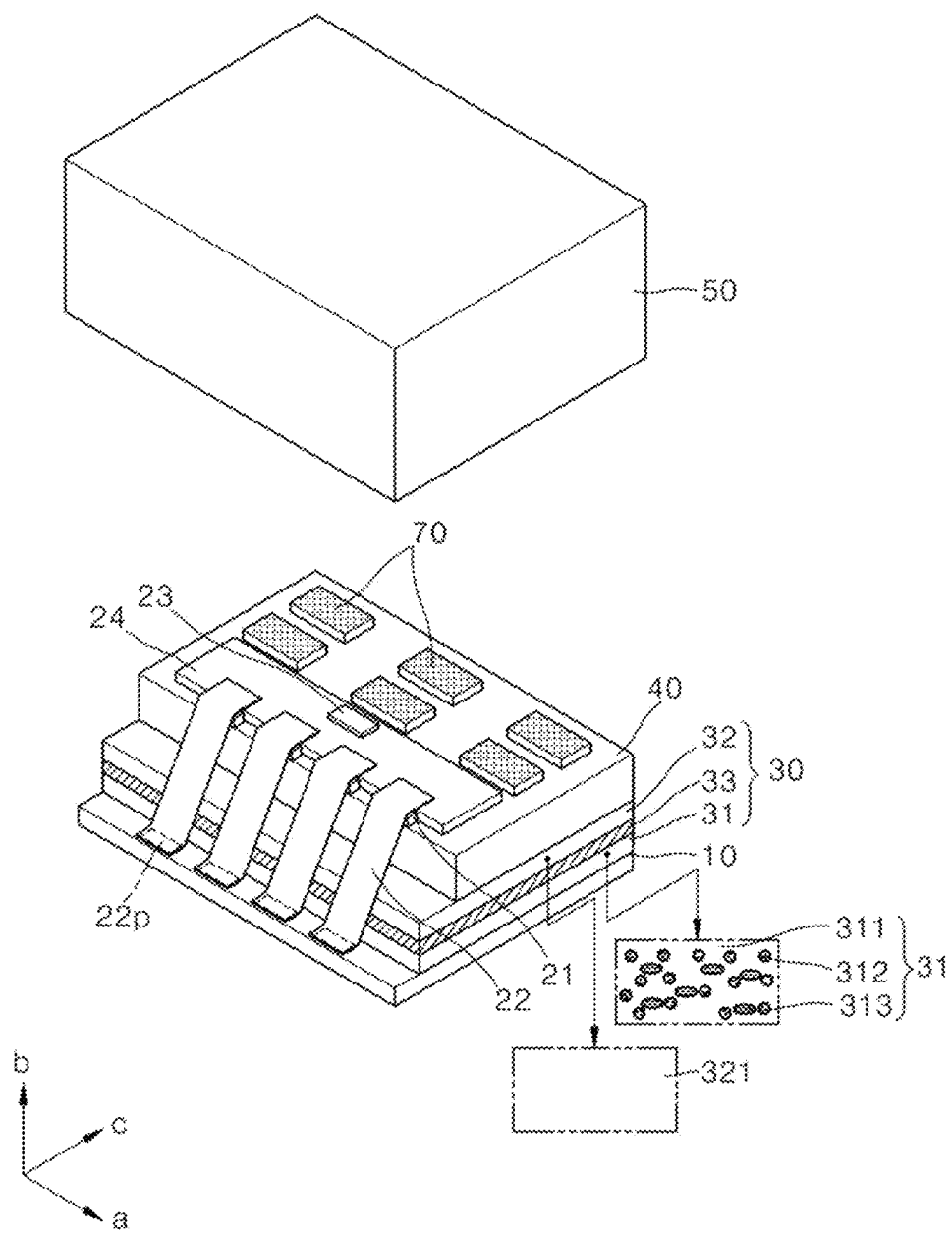
FIG. 9 is a view showing a display device according to a second embodiment of the present disclosure.

FIG. 9 is a view showing a display device according to a second embodiment of the present disclosure.

As shown in FIG. 9, in the display device according to the second embodiment of the present disclosure, a second adhesive layer 32 of the sealing structure 30 can be made of only the second polymer material 321 having adhesiveness.

For example, unlike the second adhesive layer 32 shown in the FIG. 6, the second metal particles 322 in FIG. 6 is not included in the second adhesive layer 32 of the sealing structure 30. As a result, the mixing percentage of the polymer material included in the second adhesive layer 32 can be increased, compared to that in the first adhesive layer 31. Thus, the adhesiveness of the second adhesive layer 32 can be higher than the adhesiveness of the first adhesive layer 31, such that the reliability of fixing the reinforcing substrate 40 can be improved.

Figure 10:
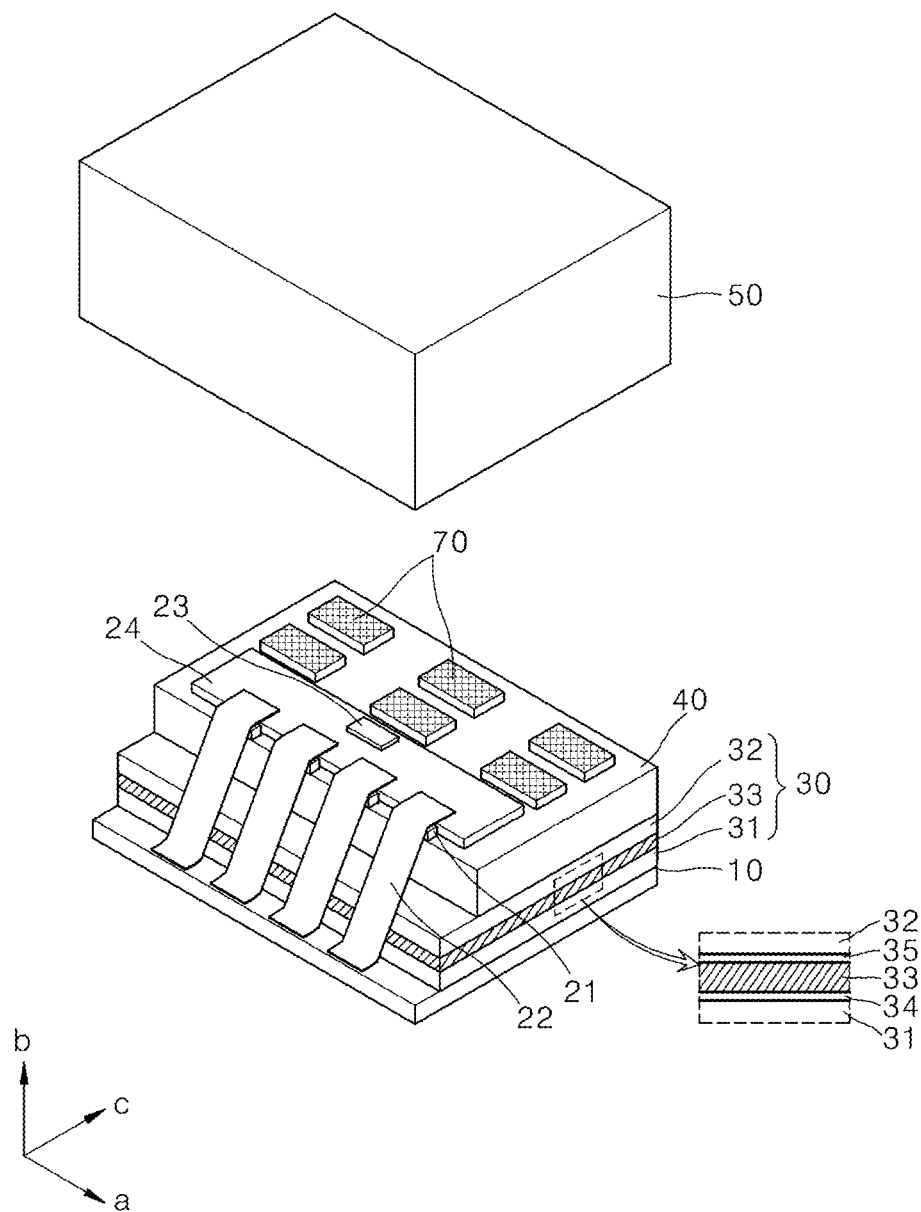
FIG. 10 is a view showing a display device according to a third embodiment of the present disclosure.

FIG. 10 is a view showing a display device according to a third embodiment of the present disclosure.

As shown in FIG. 10, in the display device according to the third embodiment of the present disclosure, the sealing structure 30 can have not only the barrier layer 33 made of a metal material, but also at least one of a first auxiliary barrier layer 34 disposed between the first adhesive layer 31 and the barrier layer 33, and a second auxiliary barrier layer 35 disposed between the second adhesive layer 32 and the barrier layer 33.

For example, the sealing structure 30 can further include one of the first and second auxiliary barrier layers 34 and 35.

Alternatively, the sealing structure 30 can further include both the first and second auxiliary barrier layers 34 and 35.

Each of the first and second auxiliary barrier layers 34 and 35 can be made of an inorganic insulating material such as $SiO_x$ or $SiON_x$. Other choice of materials can be used.

In this way, as the barrier layer 33 made of the metal material is disposed between the first and second adhesive layers 31 and 32, the thermal conductivity of the sealing structure 30 can be improved. In addition, the adhesiveness between each of the first and second adhesive layers 31 and 32 and the barrier layer 33 can be improved due to each of the first and second auxiliary barrier layers 34 and 35. Thus, a sealing force and rigidity of the sealing structure 30 can be improved. In addition, as first and second auxiliary barrier layers 34 and 35 made of an inorganic insulating material are disposed on a top face and a bottom face of the barrier layer 33 of a metal material, pinholes that can be generated in the barrier layer 33 of the metal material can be filled with the first and second auxiliary barrier layers 34 and 35, so that pinhole defects can be prevented or effectively reduced.

Figure 11:
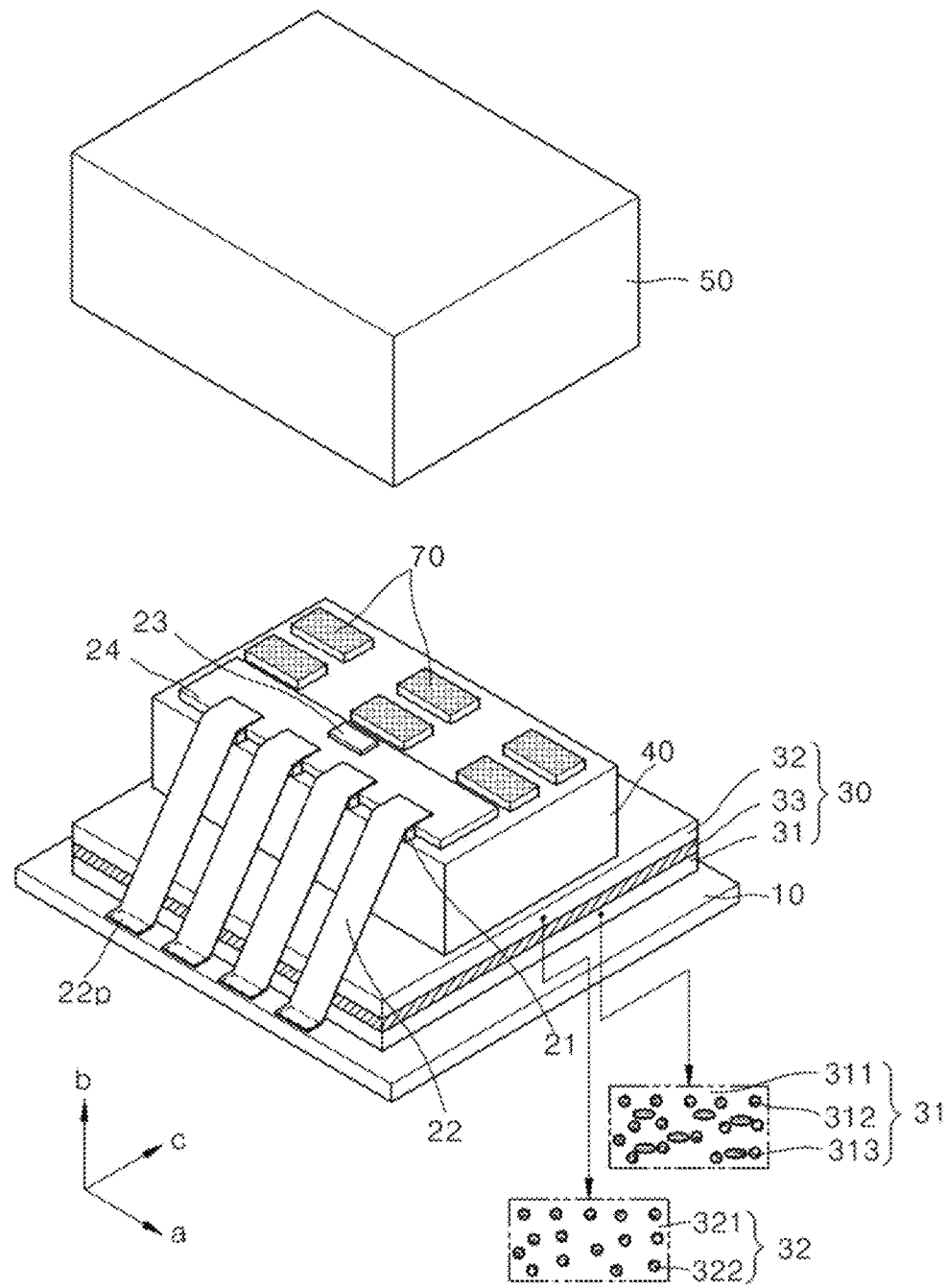
FIG. 11 is a view showing a display device according to a fourth embodiment of the present disclosure.
Figure 12:
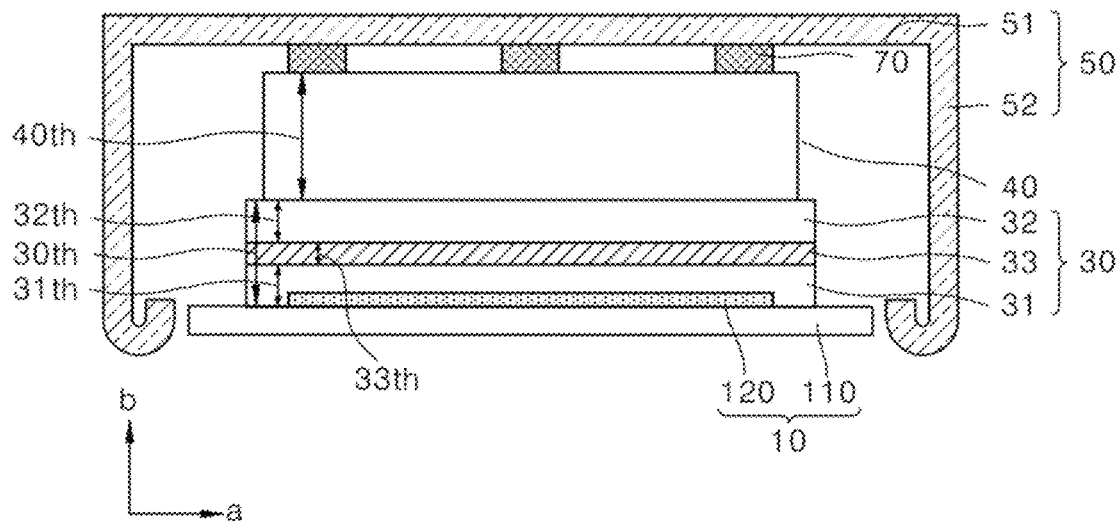
FIG. 12 is a view showing an example of an ab plane cross-section of FIG. 11.
Figure 13:
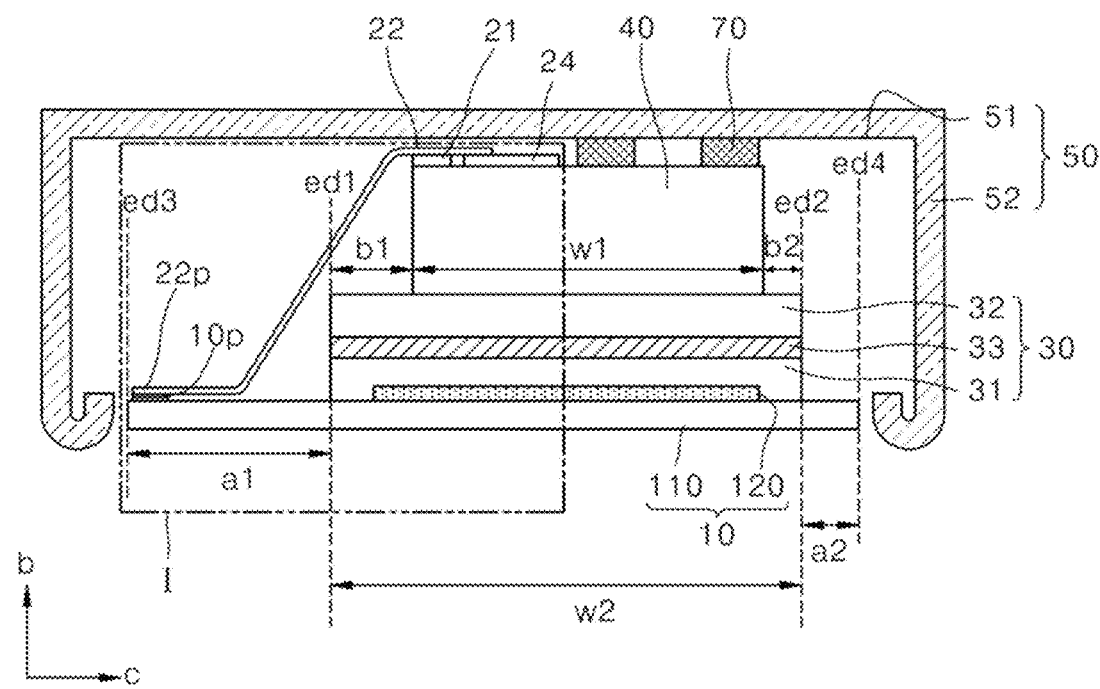
FIG. 13 is a view showing an example of a cb plane cross-section of FIG. 11.
Figure 14:
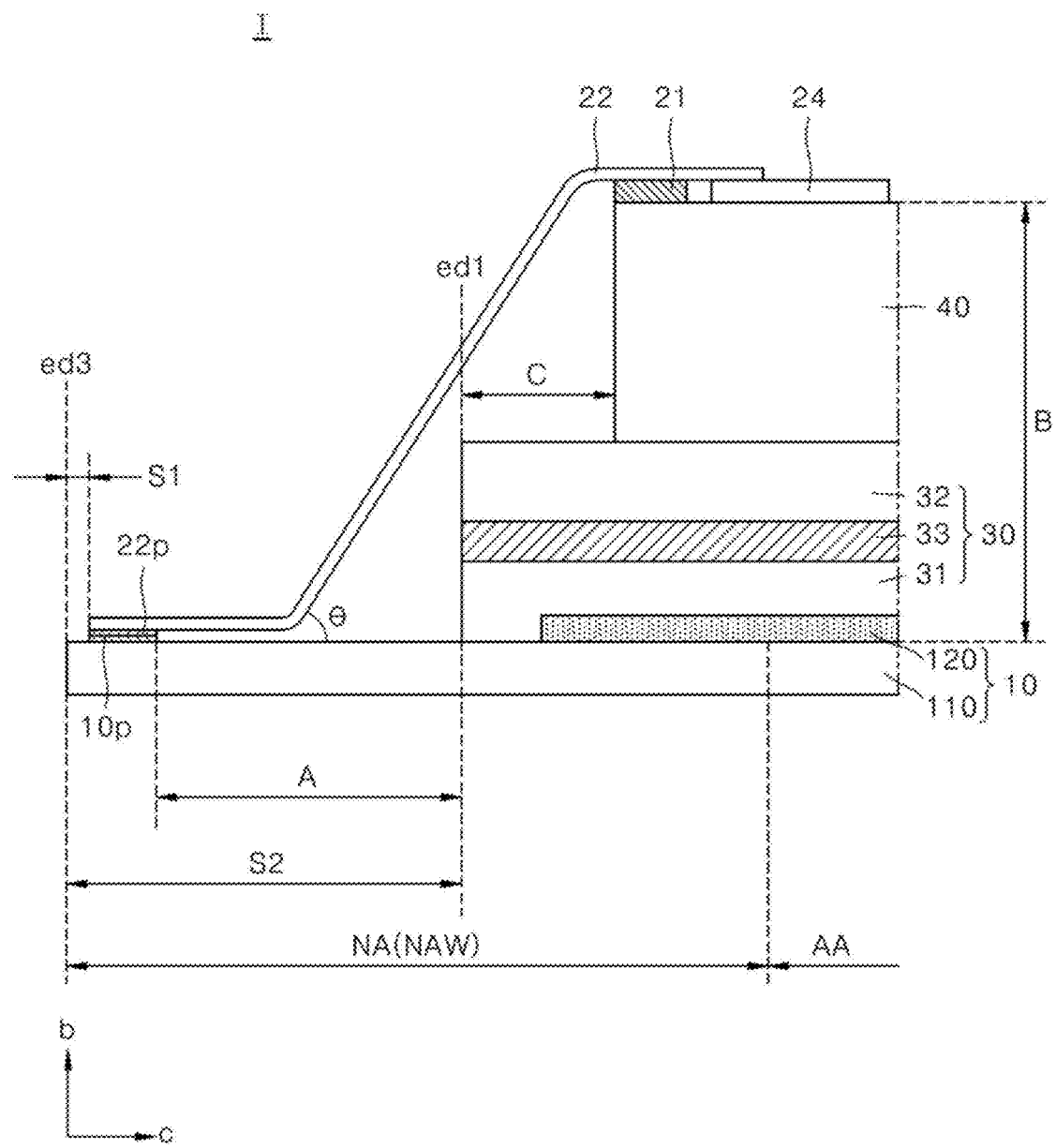
FIG. 14 is an enlarged view of portion 'I' of FIG. 13.

FIG. 11 is a view showing a display device according to a fourth embodiment of the present disclosure. FIG. 12 is a view showing an example of an a-b plane cross-section of FIG. 11. FIG. 13 is a view showing an example of a c-b plane cross-section of FIG. 11. FIG. 14 is an enlarged view of an 'I' portion of FIG. 13. FIG. 15a to FIG. 15d are views showing various structures of the barrier layer. In this connection, the same or similar components from FIG. 5 to FIG. 10 will be briefly described.

Referring to FIGS. 11 to 13, the display device according to the fourth embodiment of the present disclosure can include a bottom cover 50 having a bottom portion 51 and a side portion 52, an adhesive pattern 70, an array substrate 10 having a light-emitting array 120 including a plurality of light-emitting elements corresponding to a plurality of pixel areas, and a sealing structure 30 disposed on the array substrate and fixing a plate-like reinforcing substrate 40 facing toward the sealing structure 30 to the array substrate 10 while sealing the light-emitting array 120.

In this connection, the array substrate 10 can be referred to as a support substrate, the reinforcing substrate 40 can be referred to as a bonding substrate, and the sealing structure 30 can be referred to as a bonding structure. Further, the first adhesive layer 31 can be referred to as a sealing adhesive layer, the barrier layer 33 can be referred to as a bonding reinforcing thermal conductive layer, and the second adhesive layer 32 can be referred to as a bonding reinforcing adhesive layer. Accordingly, the bonding structure can be referred to as being composed of the sealing adhesive layer, the bonding reinforcing heat conductive layer, and the bonding reinforcing adhesive layer on the support substrate.

The array substrate 10 can include a transistor array 110 and a light-emitting array 120. The transistor array 110 is formed on a base substrate 111 made of transparent glass or plastic (see FIG. 4). The light-emitting array 120 can include a plurality of organic light-emitting elements OLEDs corresponding to a plurality of pixel areas.

The array substrate 10 can include a display area AA (see FIG. 2), and a non-display area NA surrounding the display area AA (see FIG. 2). A plurality of pads 10p can be spaced apart from each other and can be disposed at an area of the non-display area NA adjacent to one side edge of the display area AA.

The light-emitting array 120 can be disposed on the display area AA of the array substrate 10, and a sealing structure 30 for sealing a front surface of the light-emitting array 120 can be disposed. The sealing structure 30 can be spaced apart by a first spacing a1 from one side edge ed3 of the array substrate 10 in one direction and by a second spacing a2 from an opposite side edge ed4 of the array substrate 10 to the one side edge ed3. In this connection, the first spacing a1 and the second spacing a2 can be equal to each other. Alternatively, as a plurality of pads 10p are arranged on the one side edge ed3 of the array substrate 10, the second spacing a2 can have a minimum spacing value for realizing a narrow bezel, and the first spacing a1 can have a larger value than the second spacing a2 so as to secure a minimum space in which the plurality of pads 10p are disposed.

As the sealing structure 30 is spaced apart from each of the side edges ed3 and ed4 of the array substrate 10 by each of the predetermined spacings, a portion of a top surface of the array substrate 10 can be exposed.

The sealing structure 30 can include a first adhesive layer 31 positioned to face toward the array substrate 10, a second adhesive layer 32 positioned to face toward the reinforcing substrate 40, and a barrier layer 33 disposed between the first adhesive layer 31 and the second adhesive layer 32.

The first adhesive layer 31 positioned to face toward the array substrate 10 can include a first polymer material 311 having an adhesiveness. The first adhesive layer 31 can surround an entire face of the array substrate 10 in order to inhibit penetration of moisture in a lateral direction of the array substrate 10, and prevent inflow of external gas and oxygen causing damage to the light-emitting array 120 provided on the array substrate 10.

The first adhesive layer 31 is made of the first polymer material 311. For example, the first adhesive layer 31 can be made of any one of a polymer material selected from an olefin-based polymer, an epoxy-based polymer, and an acrylate based polymer.

In one example, the first adhesive layer 31 can be composed of a mixture including the above-described first adhesive polymer material 311 and the first particles 312 made of the metal material. The first particles 312 made of the metal material can include nickel (Ni). As the first particles 312 made of the metal material are included in the first adhesive layer 31, the first adhesive layer 31 can have relatively higher thermal conductivity than that of the first adhesive layer 31 made only of the adhesive polymer material. Thus, the heat dissipation effect thereof can be improved.

The first adhesive layer 31 can further include a hygroscopic inorganic filler 313. The hygroscopic inorganic filler 313 prevents moisture from penetrating into the light emitting array 120 of the array substrate 10. The hygroscopic inorganic filler 313 can include at least one of CaO, MaO, and BaO.

The barrier layer 33 is disposed between the first adhesive layer 31 and the second adhesive layer 32 to prevent moisture from penetrating toward a front face of the array substrate 10. Further, the barrier layer 33 reinforces the bonding between the first and second adhesive layers 31 and 32 and implements a stack structure thereof, thereby securing reliability of fixation and bonding even when a thickness of the reinforcing substrate 40 becomes larger. In addition, the presence of the barrier layer 33 in the sealing structure can increase the reduction in the warpage amount of the array substrate 10 and the reinforcing substrate 40.

In order to secure the reliability of fixing the reinforcing substrate 40, an elongation of a material constituting the barrier layer 33 can be larger and a yield strength value thereof can be smaller. In one example, the elongation of the material constituting the barrier layer 33 is 4% or greater, and the yield strength has a value of 360 Mpa or smaller.

The barrier layer 33 can include at least one of a metal material and an inorganic insulating material. For example, the barrier layer 33 can include a metal material such as Al, Cu, Sn, Ag, Fe, or Zn, or an alloy of the above-described metal materials. Further, the barrier layer 33 can include an inorganic insulating material such as silicon oxide $SiO_x$ or silicon oxynitride $SiON_x$.

Figure 15A:
FIG. 15a to FIG. 15d are views showing various structures of a barrier layer.
Figure 15B:
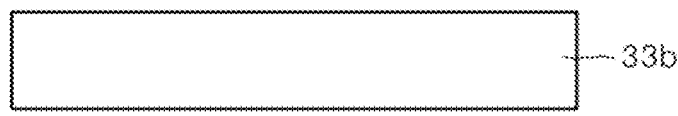
Figure 15C:
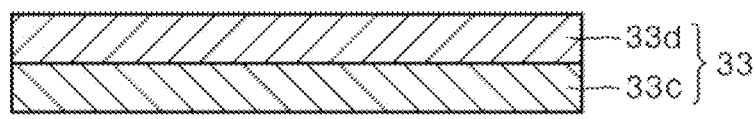
Figure 15D:
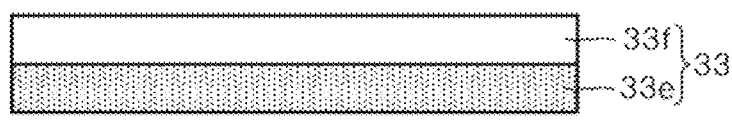

The barrier layer 33 can have a single layer structure or a multilayer structure. For example, referring to FIG. 15a to FIG. 15d, the barrier layer 33 can be formed in a single layer structure composed of a metal film 33a including a metal material (FIG. 15a), or can be formed in a single layer structure composed of an inorganic insulating film 33b including an inorganic insulating material (FIG. 15b), or can be formed in a stack structure in which a first metal film 33c and a second metal film 33d including different metal materials are stacked (FIG. 15c) or can be formed in a stack structure in which a first inorganic insulating film 33e and a second inorganic insulating layer 33f including different inorganic insulating materials are stacked (FIG. 15d).

Further, although not shown in the drawings, the barrier layer 33 can have a multilayer structure in which a plurality of cycles are stacked, wherein one cycle has a structure in which the first metal film 33c and the second metal film 33d are stacked. Alternatively, the barrier layer 33 can have a multilayer structure in which a plurality of cycles are stacked, wherein one cycle has a structure in which the first inorganic insulating layer 33e and the second inorganic insulating layer 33f are stacked. Alternatively, a thin film structure composed of a single layer of the metal film 33a or the inorganic insulating film 33b can be repeatedly stacked to form the barrier layer 33.

When the barrier layer 33 is formed in the multi-layer structure including layers of different materials, the barrier properties that prevent moisture from penetrating toward a front face of the array substrate 10 can be improved.

The second adhesive layer 32 is positioned to face toward the reinforcing substrate 40. The second adhesive layer 32 can serve to fix the reinforcing substrate 40 and can include a polymer material having adhesiveness.

The second adhesive layer 32 is made of a polymer material that does not contain a carboxyl group. For example, the second adhesive layer 32 can be made of any one polymer material selected from among olefin-based polymer, epoxy-based polymer, acrylate based polymer, amine based polymer, phenol based polymer, and acid anhydride based polymer, and each of which does not contain a carboxyl group.

The second adhesive layer 32 is made of a polymer material that does not contain a carboxyl group, thereby preventing the barrier layer 33 from being damaged, thereby preventing the display device from being defective. Accordingly, the reliability of the display device can be secured.

Specifically, the adhesive layer can include a polymer material having adhesive properties for allowing adhesion to an adhering target. However, when the carboxyl group is contained in the adhesive polymer material, the barrier layer 33 can be damaged, which can cause a defect in the display device. Hereinafter, this will be described with reference to the drawings.

FIGS. 16a, 16b, 17 and 18 are photographs to illustrate whether defects occur depending on a material constituting the adhesive layer.

Figure 16A:
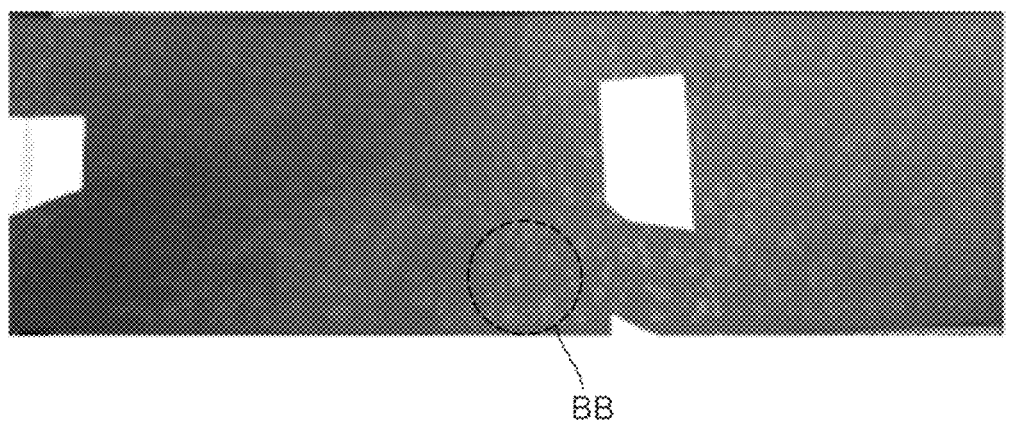
FIGS. 16a, 16b, 17 and 18 are photographs for illustrating whether defects occur depending on a type of a material constituting an adhesive layer.

For example, referring to FIG. 16, when the barrier layer 33 is made of a metal material such as aluminum, and when an adhesive layer can include a polymer material containing a carboxyl group, a plurality of air bubbles BB are generated on the adhesive layer via a chemical reaction between the material constituting the barrier layer 33 and the adhesive layer (See FIG. 16a).

The plurality of air bubbles spread to the barrier layer 33 in contact with the adhesive layer, and thus a plurality of air bubbles are generated on a surface of the barrier layer 33. The bubbles generated on the surface of the barrier layer 33 can act as a penetration path of oxygen or moisture. Thus, the oxygen or moisture can cause corrosion of the barrier layer 33 made of a metal material. In addition, oxygen or moisture penetrates the corrosion of the barrier layer 33 again, thereby causing a defect (DF) on a front face of the panel (See FIG. 17).

Figure 18:
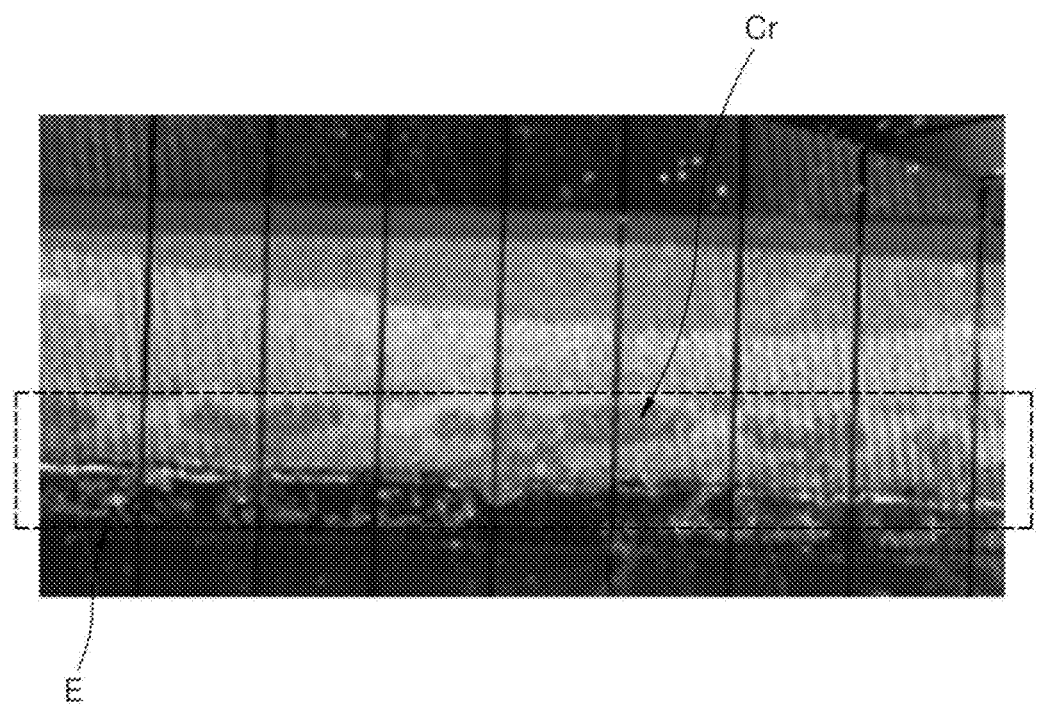

In particular, as shown in FIG. 18, when these bubbles are generated on an edge E of the barrier layer 33, the moisture penetration rate through pores of the edge E bubbles increases, such that the corrosion (Cr) of the barrier layer 33 can be further accelerated.

Further, when the barrier layer 33 can include an inorganic insulating material, the surface of the barrier layer 23 can be uneven when a polymer material containing a carboxyl group is used as the adhesive layer. In other words, the film uniformity of the barrier layer 23 can be deteriorated. When the film uniformity is lowered, the adhesion ability is lowered. When damage to the barrier layer 23 occurs, a defect can occur in the panel.

Figure 16B:
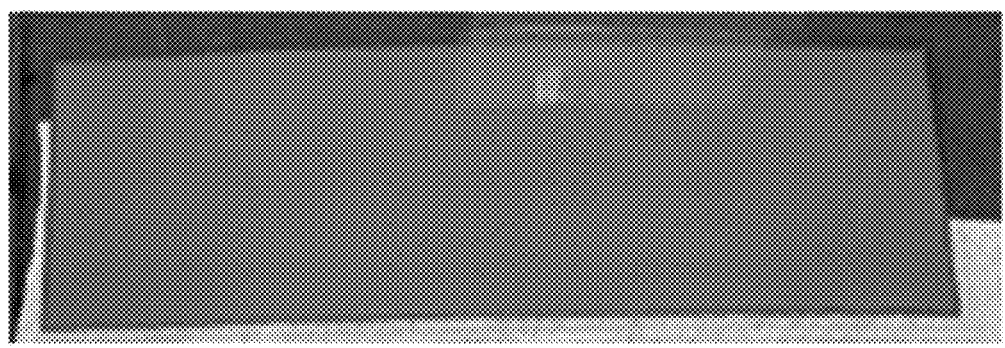
Figure 17:
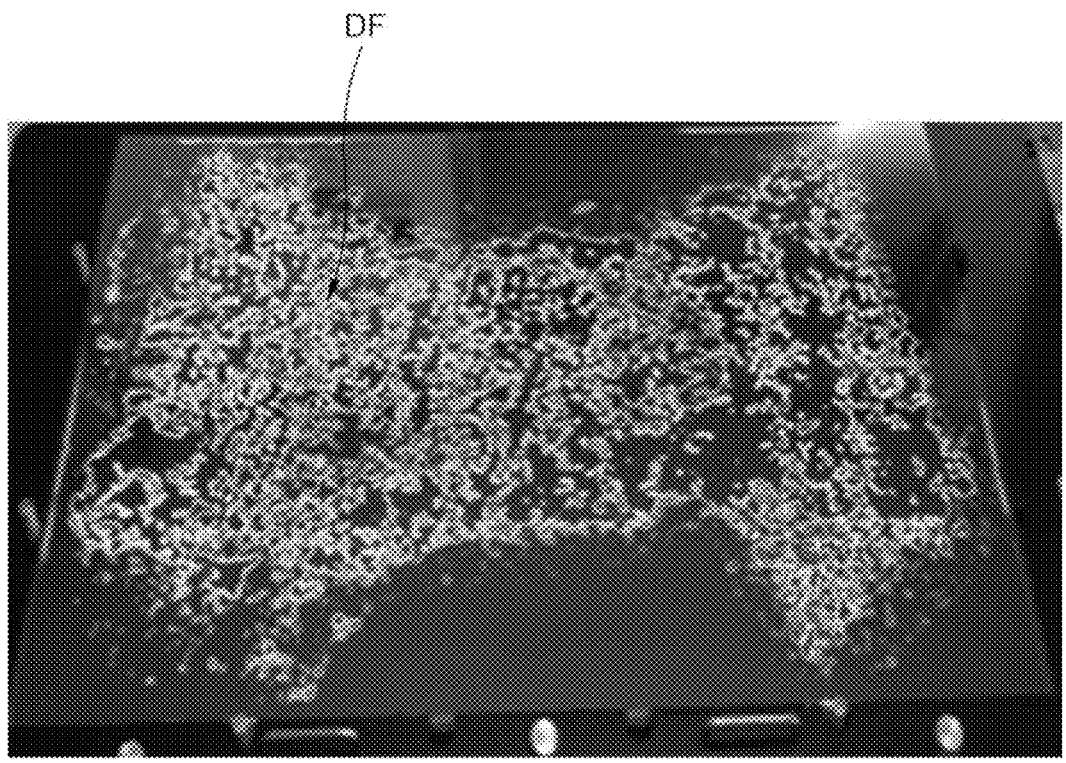

On the contrary, when a polymer material that does not contain a carboxyl group constitutes the second adhesive layer 32 according to an embodiment of the present disclosure, as shown in FIG. 16b, a surface of the second adhesive layer 32 can be maintained as a smooth surface without air bubbles thereon, thereby preventing corrosion of the barrier layer 33, thereby realizing a high-quality panel. Further, the film uniformity of the barrier layer 33 can be maintained uniformly, so that the adhesion ability can be prevented from being deteriorated.

As the second adhesive layer 32 is not in contact with the light-emitting array 120, a hygroscopic inorganic filler is not included in the second adhesive layer 32, and only a second adhesive polymer material 321 and second metal particles 322 are included therein. As the second particles 322 made of the metal material are included in the second adhesive layer 32, the heat dissipation effect of the second adhesive layer 32 can be improved as the second adhesive layer 32 can have relatively higher thermal conductivity than that of the second adhesive layer 32 only made of the adhesive polymer material 321.

The reinforcing substrate 40 in a form of a flat plate can be disposed on the second adhesive layer 32. The reinforcing substrate 40 can be positioned on the other face opposite to one face of the second adhesive layer 32 facing toward the barrier layer 33.

The reinforcing substrate 40 can include a metal material to effectively dissipate heat from the light-emitting array 120 when the light-emitting array 120 emits light. For example, the reinforcing substrate 40 can be made of a metal material including Al, Cu, Sn, Ag, Fe, Zn or an alloy thereof. In another example, the reinforcing substrate 40 can be made of a glass or polymer plastic material.

A thermal conductivity of Invar which is made of an alloy of iron and nickel, which is one of metal materials with higher thermal conductivity is 16 W/K·m, and that of stainless steel (SUS) is 23.9 W/K·m. On the contrary, a thermal conductivity of aluminum (Al) is 193 W/K·m, which is about 10 times higher than that of each of Invar and stainless steel (SUS). Thus, aluminum (Al) can more effectively dissipate the heat. Accordingly, the reinforcing substrate 40 made of aluminum (Al) can, thereby secure a higher heat dissipation effect than that made of Invar or SUS.

In particular, thermal conductivity affects the temperature inside the panel in relation to the heat dissipation of the display device, and thus is highly related to the afterimage and the lifespan of the light-emitting array. For example, the higher the thermal conductivity, the lower the temperature inside the panel. Thus, as the temperature decreases, occurrence of the afterimage on the panel can be reduced, and the lifespan of the light-emitting array can be increased.

FIG. 19 is a table showing a maximum temperature and afterimage reduction rate measured inside the panel by each metal material.

Referring to FIG. 19, when Invar is used as the material constituting the reinforcing substrate 40, the maximum temperature measured inside the panel was 40.3 degrees C. On the contrary, when aluminum (Al) is used as the material constituting the reinforcing substrate 40, the maximum temperature measured inside the panel is 34.6 degrees C. when the aluminum (Al) thickness was 1.0 mm, the maximum temperature measured inside the panel was 34 degrees C. when the aluminum (Al) thickness was 1.5 mm.

In other words, when aluminum (Al) is used for the reinforcing substrate 40, the maximum temperature measured inside the panel is lower by 5.7 degrees C. and 6.3 degrees C. ($\Delta T$) than that when Invar is used for the reinforcing substrate 40. Thus, it can be identified that the temperature inside the panel is effectively reduced due to the high thermal conductivity of aluminum.

As the maximum temperature inside the panel decreases by 1 degree C., the reduction rate of a basic afterimage increases by about 4%. Therefore, when the aluminum (Al) thickness is 1.0 mm, the afterimage is reduced by 22.8% compared to that when Invar is used for the reinforcing substrate 40. When the thickness of aluminum (Al) is 1.5 mm, the afterimage is reduced by 25.2% compared to that when Invar is used for the reinforcing substrate 40. That is, it can be identified that aluminum has a higher heat dissipation effect than Invar has.

Further, it can be identified that when the same aluminum (Al) material is used for the reinforcing substrate, the thermal conductivity of the reinforcing substrate 40 varies based on a thickness of aluminum. In other words, the larger the aluminum thickness, the higher the thermal conductivity of the reinforcing substrate 40. Accordingly, the reinforcing substrate 40 can have a thickness ranging from 0.3 mm to 1.5 mm to effectively dissipate heat and improve the heat dissipation effect.

In addition, aluminum (Al) has a density of 2.68 $g/cm^3$ and thus has a relatively lower density compared to Invar which has a density of 8.2 $g/cm^3$, and stainless steel (SUS), which has a density of 7.7 $g/cm^3$, and thus Al has a light weight. Accordingly, when Al, Invar, and SUS are used for the reinforcing substrate at the same thickness, a panel weight when Al is used can be reduced by two to three times than that when SUS or Invar is used for the reinforcing substrate, thereby making the display device slimmer and lighter.

Each of a thickness 31*th* of the first adhesive layer 31 and a thickness 32*th* of the second adhesive layer 32 can be limited to a thickness larger than or equal to a thickness at which defects can be prevented from occurring. In this connection, the defect can be, for example, a hole formed in each of the first adhesive layer 31 and the second adhesive layer 32, but can not be limited thereto.

Further, each of the thickness 31*th* of the first adhesive layer 31 and the thickness 32*th* of the second adhesive layer 32 can be limited to a value smaller than or equal to a critical thickness of a single adhesive layer at which process defects can be prevented from occurring. In this connection, the process defect can include decrease in a thickness uniformity due to insertion of foreign substances or sliding phenomenon. Further, when the thickness of the adhesive layer becomes larger than the critical thickness, an area exposed to an outside can increase, such that moisture can easily invade, and thus, the defects can occur.

For example, each of the thicknesses 31*th* and 32*th* of the first and second adhesive layers 31 and 32 can be in a range of 10 μm to 100 μm. When each of the thicknesses 31*th* and 32*th* of the first or second adhesive layers 31 and 32 is smaller than 10 μm, hole defects can occur. Thus, it is preferable that each of the thicknesses 31*th* and 32*th* of the first or second adhesive layers 31 and 32 is larger than 10 μm. Further, when each of the thicknesses 31*th* and 32*th* of the first or second adhesive layers 31 and 32 is larger than 100 μm, the process defect can occur.

Further, a total thickness of the thicknesses 31*th* and 32*th* of the first and second adhesive layers 31 and 32 can be limited to a thickness at which reliability of fixing the reinforcing substrate 40 (having a thickness 40*th*) can be secured. In this connection, the reliability of the fixation of the reinforcing substrate 40 can be understood as an ability of fixing the reinforcing substrate 40 so as not to be removed from the second adhesive layer 32 when the thickness of the reinforcing substrate 40 increases. For example, the total thickness of the thicknesses 31*th* and 32*th* of the first and second adhesive layers 31 and 32 can be larger than 20 μm.

A thickness 33*th* of the barrier layer 33 can be greater than 10 μm and smaller than each of the thicknesses 31*th* and 32*th* of the first and second adhesive layers 31 and 32. In this way, defects such as holes and/or pinholes in the barrier layer 33 can be prevented, and at the same time, a thickness of the sealing structure 30 (having a thickness 30*th*) can be prevented from increasing unnecessarily due to the barrier layer 33.

Accordingly, the sealing structure 30 according to an embodiment of the present disclosure can be embodied as a stack in which the first adhesive layer 31 and the second adhesive layer 32 are disposed on the top and bottom faces of the barrier layer 33, respectively. Thus, the process defect can be reduced compared to a case when the sealing structure 30 is made of a single adhesive layer. Further, the sealing structure 30 having the larger thickness and thus having a stable shape can be realized.

Further, as the thicker sealing structure 30 can be implemented, the reinforcing substrate 40 fixed by the sealing structure 30 can also be implemented to have a larger thickness. Further, as the sealing structure 30 is formed in the multi-layer structure, the array substrate 10 and the reinforcing substrate 40 can be stably bonded to each other while not causing defects such as sliding even when the reinforcing substrate 40 is formed to have a larger thickness.

Further, as the reinforcing substrate 40 can be formed to be thicker due to the sealing structure 30, the reinforcing substrate 40 can effectively dissipate the heat emitted from the light-emitting array 120 and thus the heat dissipation can be improved. Accordingly, the warpage amount that can occur due to the heat generation can be reduced.

In one example, referring again to FIG. 11 to FIG. 14, the display device further can include at least one flexible circuit board 22 connected to the array substrate 10 and a printed circuit board 24 connected to the flexible circuit board 22. An integrated circuit chip 21 corresponding to the data driver (62 in FIG. 2) is mounted on each flexible circuit board 22. Further, an integrated circuit chip 23 corresponding to the timing controller (61 in FIG. 2) is mounted on the printed circuit board 24.

The printed circuit board 24 is disposed on one face of the reinforcing substrate 40. One side of each flexible circuit board 22 is electrically connected to a pad 10p of the array substrate 10 through a pad 22p of each flexible circuit board 22, and the other side of the flexible circuit board 22 is connected to a pad of the printed circuit board 24.

The flexible circuit board 22 extends from the reinforcing substrate 40 to the array substrate 10 in an elongate line shape. In this connection, when the flexible circuit board 22 comes into contact with an edge of the reinforcing substrate 40 made of a hard material and having a somewhat rough surface, damage to the flexible circuit board 22 can occur. Accordingly, a width w1 of the reinforcing substrate 40 is smaller than a width w2 of the sealing structure 30.

Specifically, one side edge ed1 of the sealing structure 30 is spaced apart from one side edge ed3 of the array substrate 10 by a first spacing a1 and is disposed in the inner direction where the light-emitting array 120 is disposed. The other side edge ed2 opposite to the side edge ed1 of the sealing structure 30 is spaced apart from the other side edge ed4 of the array substrate 10 by a second spacing a2. In this connection, as the plurality of pads 10p are disposed on the one side edge ed3 of the array substrate 10, the first spacing a1 can be larger than the second spacing a2.

Further, the reinforcing substrate 40 can be spaced apart from one side edge ed1 of the sealing structure 30 by a first spacing b1, and can be spaced apart from the other side edge ed2 by a second spacing b2. Accordingly, a portion of a top surface of the second adhesive layer 32 of the sealing structure 30 is not covered with the reinforcing substrate 40 but is exposed.

In one example, adjusting a thickness of the reinforcing substrate 40 can allow a shift offset value C as the first spacing b1 to be adjusted. In this connection, the reinforcing substrate 40 is spaced apart from one side edge ed1 of the sealing structure 30 by the first spacing b1 and is disposed in the inner direction where the light-emitting array 120 is disposed. Controlling the shift offset value C can prevent the flexible circuit board 22 from contacting the reinforcing substrate 40 or the sealing structure 30 and thus from being damaged.

In addition, for realizing a narrow bezel of the display device, the flexible circuit board 22 and the sealing structure 30 can be spaced from one side edge ed3 of the array substrate 10 by minimum spacings S1 and S2 (FIG. 14), respectively. Further, the reinforcing substrate 40 can be spaced apart from one side edge ed1 of the sealing structure 40 by the first spacing (b1 in FIG. 13) in consideration of the shift offset C.

For example, in order to maximize implementation of the narrow bezel, the reinforcing substrate 40 is spaced apart by a minimum spacing from one side edge ed3 of the array substrate 10 and is disposed in the inner direction where the light-emitting array 120 is disposed. The reinforcing substrate 40 can overlap a boundary between the display area AA and the non-display area NA of the array substrate 10.

The sealing structure 30 and the reinforcing substrate 40 can be sequentially stacked on the opposite face to a light emitting face of the array substrate 10, for example, on a non-light-emitting face thereof. Accordingly, the array substrate 10, the sealing structure 30 and the reinforcing substrate 40 are arranged to form a stepped shape. The lowermost layer of the stepped shape constitutes an area in which a portion of the non-display area NA as the non-light-emitting face of the array substrate 10 is exposed. A middle layer of the stepped shape constitutes an area in which a portion of a top face of the second adhesive layer 32 of the sealing structure 30 is exposed. The uppermost layer of the stepped shape constitutes an area where a top face of the reinforcing substrate 40 is exposed. In one example, the display device can have a stepped shape when viewed toward each of four side faces of the array substrate 10. In another example, the display device can have a stepped shape when viewed toward at least one portion of the array substrate 10 in which the plurality of pads 10p, 22p are disposed.

In the display device having such a stepped shape, areas of the array substrate 10, the sealing structure 30 and the reinforcing substrate 40 in a plan view can be have a different size from each other. In one example, in a plan view, the array substrate 10 among the array substrate 10, the sealing structure 30 and the reinforcing substrate 40 can have the largest area, while the reinforcing substrate 40 among the array substrate 10, the sealing structure 30 and the reinforcing substrate 40 can have the smallest area. Further, the sealing structure 30 can have an area smaller than the area of the array substrate 10 and larger than the area of the reinforcing substrate 40. In another example, three sides among four sides of the sealing structure 30 overlap with those of the reinforcing substrate 40, while the remaining side among four sides of the sealing structure 30 that does not overlap with the reinforcing substrate 40 is exposed to have the plurality of pads 10p, 22p thereon.

The shift offset value C will be described with reference to FIG. 14 and a following [Equation 1]:

Equation 1

$$C = \left\{\frac{B}{\text{Tan}\theta}\right\} - A \qquad \text{Equation 1}$$

C=shift offset value
B=thickness of sealing structure+thickness of reinforcing substrate
A=spacing between pad and sealing structure Referring to FIG. 14 and [Equation 1], a value by which a position of the reinforcing substrate 40 spaced inwardly, by the first spacing, from one side edge ed1 of the sealing structure 30 is displaced can be defined as the shift offset value C. An inclination angle θ can be defined as an inclination angle of the flexible circuit board 22 having one side connected to the array substrate 10 and the other side connected to the printed circuit board 24. Further, a spacing A between the pad and the sealing structure can be defined as a spacing between a side edge of the sealing structure 30 and a side edge of the pad 10p disposed on a side edge of the array substrate 10 facing toward the side edge of the sealing structure 30.

The shift offset value C can have a larger value as a sum B of the thicknesses of the sealing structure 40 and the reinforcing member 40 increases.

A position of the pad 10p on the array substrate 10 is fixed due to a possible damage to a module and a position of the sealing structure 30 is also fixed. Thus, a value of the spacing A between the pad and the sealing structure is substantially fixed. Further, the inclination angle θ of the flexible circuit board 22 can be in a range of 5 to 30 degrees, preferably at about 11.3 degrees. Following embodiments will be described in a case that the inclination angle θ of the flexible circuit board 22 is maintained at about 11.3 degrees. Accordingly, the shift offset value C can be determined based on the sum B of the thickness of the sealing structure 40 and the thickness of the reinforcing substrate 40. In particular, the shift offset value C can change based on thickness change of the reinforcing substrate 40. The reinforcing substrate 40 can be displaced from one side edge ed1 of the sealing structure 30 inwardly and toward the display area of the array substrate 10. Hereinafter, the present disclosure will be described with reference to [Table 1].

non-overlapping area in which the array substrate 10 is not covered with the reinforcing substrate 40 occurs in the display area AA on the array substrate 10. When the non-overlapping area occurs, the heat dissipation performance at a portion of the array substrate 10 in the non-overlapping area can be lowered, such that an afterimage is generated in this area.

Accordingly, it is preferable to limit the shift offset value C to within the critical range in order to maintain the narrow bezel and slimness of the display device while securing the heat dissipation characteristics of the reinforcing substrate 40. The critical range of the shift offset value C can be set

TABLE 1

| Examples | θ | A | Thickness of sealing structure | Thickness of reinforcing substrate | C | D | Out of or within critical range |
|---|---|---|---|---|---|---|---|
| Example 1 | 11.3° | 0.74 | 0.1 | 0.3 | 2.0 mm | 54% | Within |
| Example 2 | 11.3° | 0.74 | 0.1 | 0.5 | 3.0 mm | 43% | Within |
| Example 3 | 11.3° | 0.74 | 0.1 | 1 | 5.5 mm | 14% | Within |
| Example 4 | 11.3° | 0.74 | 0.1 | 1.5 | 7.27 mm | 10.50% | Within |
| Example 5 | 11.3° | 0.74 | 0.1 | 2 | 10 mm | −35.90% | Out of |
| Example 6 | 11.3° | 0.74 | 0.1 | 3.5 | 15 mm | −92% | Out of |
| Example 7 | 11.3° | 0.74 | 0.1 | 5 | 25 mm | −204% | Out of |

[Table 1] shows change in the shift offset value C when the thickness of the reinforcing substrate 40 changes and when each of the spacing A between the pad and the sealing structure, the thickness of the sealing structure 30 and the inclination angle θ of the flexible circuit board 22 is constant. Referring to Examples 1 to 7 in [Table 1], it can be identified that when the thickness of the reinforcing substrate 40 increases from 0.3 mm to 5.0 mm, the shift offset value C also increases from 2.0 mm to 25 mm.

In other words, when the thickness of the reinforcing substrate 40 increases from 0.3 mm to 5.0 mm, the reinforcing substrate 40 is displaced from one side edge ed1 of the sealing structure 30 inwardly and toward the display area of the array substrate 10 by 2.0 mm to 25 mm.

As the shift offset value C increases, and thus, an amount which the reinforcing substrate 40 is displaced increases, the damage to the flexible circuit board 22 coming into contact with the reinforcing substrate 40 can be reduced. Further, as the thickness of the reinforcing substrate 40 becomes larger, the flexible circuit board 22 can be prevented from coming into contact with the side edge of the sealing structure 30.

As described above, as the shift offset value C increases, damage to the flexible circuit board 22 can be prevented. However, when the shift offset value C exceeds the critical range, the heat dissipation effect of the reinforcing substrate 40 can be reduced, a bonding strength between the array substrate 10 and the reinforcing substrate 40 can be reduced, or the warpage amount by which the panel is bent can increase. Accordingly, it is desirable to limit the shift offset value C so as not to exceed the critical range. In one example, when an area of the reinforcing substrate 40 has the same size as the display area AA or the reinforcing substrate 40 is sized such that the reinforcing substrate 40 extends from the display area AA toward the non-display area NA so as to overlap the non-display area NA, the heat dissipation effect can be maintained.

Specifically, when the reinforcing substrate 40 has a smaller width or area than that of the display area AA, a to be within a range of a width NAW of the non-display area NA. Hereinafter, the disclosure will be described with reference to [Equation 2].

$$D = \frac{(NAW - \text{pad margin width}) - C}{NAW} \times 100 \qquad \text{Equation 2}$$

In this connection, D can refer to a ratio (percentage) showing how much portion of the width NAW of the non-display area NA is overlapped with the reinforcing substrate 40. The width NAW of the non-display area NA can be defined as a spacing between an edge of the array substrate and the display area AA. The pad margin width can be defined as a spacing between a side edge of the array substrate 10 and a side edge of the sealing structure 30. Further, as C can denote a shift offset value, the width NAW of the non-display area NA can be fixed, and as the position of the sealing structure 30 can be also fixed, the pad margin width can be a fixed value.

Referring to [Equation 2], as the reinforcing substrate 40 can be disposed according to the change of the shift offset value C, the critical range of the shift offset value C can be determined based on the range of the ratio D.

For example, in Examples 1 to 7 of [Table 1], a total width of the non-display area NA was set to about 9 mm and the pad margin width was set to about 2 mm. However, the total width of the non-display area NA and the pad margin width in the table 1 are set forth for the description of the embodiments of the present specification by way of example. The present disclosure is not limited thereto.

In this case, in Example 1, the ratio (percentage) D is 54%. In Example 5, the ratio (percentage) D is −35.9%. When the ratio (percentage) D, an overlapped portion of the reinforcing substrate 40 in the non-display area NA relative to the width NAW of the non-display area NA is −35.9%, the reinforcing substrate 40 is disposed to expose an entirety of the width NAW of the non-display area NA and even a portion of the display area AA. That is, the reinforcing substrate 40 is disposed inwardly to the direction of the display area AA at the boundary of the display AA and the non-display area NA.

When the ratio (percentage) D has a negative (−) value, the reinforcing substrate 40 exposes the entirety of the non-display area NA and also exposes a portion of the display area AA. Thus, the heat dissipation performance of the operation related heat generated from the array substrate 10 in the exposed areas can be deteriorated.

Accordingly, the shift offset value C at which the narrow bezel and slimness of the display device is maintained while the heat dissipation performance of the reinforcing substrate 40 is secured can be set to be within the critical range in which the ratio (percentage) D is greater than 10% and is smaller than 55%. Further, preferably, the reinforcing substrate 40 can be positioned so as to overlap at least the boundary between the display area AA and the non-display area NA.

Accordingly, as the thickness of the reinforcing substrate 40 is increased while satisfying the ratio (percentage) D within a range of 10% to 55%, the reinforcing substrate 240 can have a width smaller than that of the sealing structure 30 exposing a portion of the uppermost surface of the sealing structure 30 can.

When the reinforcing substrate 40 is displaced such that the ratio (percentage) D is out of the critical range, the heat dissipation performance deteriorates. Thus, due to a lot of heat generated on the array substrate 10, an area around the pad 10p has higher temperature. Thus, the warpage amount by which the panel is bent occurs in the area around the pad 10p. Thus, the pad 10p of the array substrate 10 and the pad 22p of the flexible circuit board 22 can be removed from each other. Further, when the thickness of the reinforcing substrate 40 is larger than a critical thickness such that the reinforcing substrate 40 is displaced such that the shift offset value C thereof is out of the critical range of the shift offset value C, the non-display area NA of the array substrate 10, that is, the bezel area, will inevitably increase, and accordingly, a narrow bezel can not be achieved.

On the contrary, according to an embodiment of the present disclosure, adjusting the thickness of the reinforcing substrate 40 such that the shift offset value C is within the critical range can allow preventing the flexible circuit board 22 from contacting the sealing structure 30 or the reinforcing substrate 40 and thus from being damaged against the sealing structure 30 or the reinforcing substrate 40. In addition, a vertical space between the array substrate, the sealing structure, and the reinforcing substrate can be removed, and a horizontal space between the flexible circuit board and the sealing structure or the reinforcing substrate can be minimized, thereby ensuring heat dissipation ability, and realizing a narrow bezel.

Figure 20:
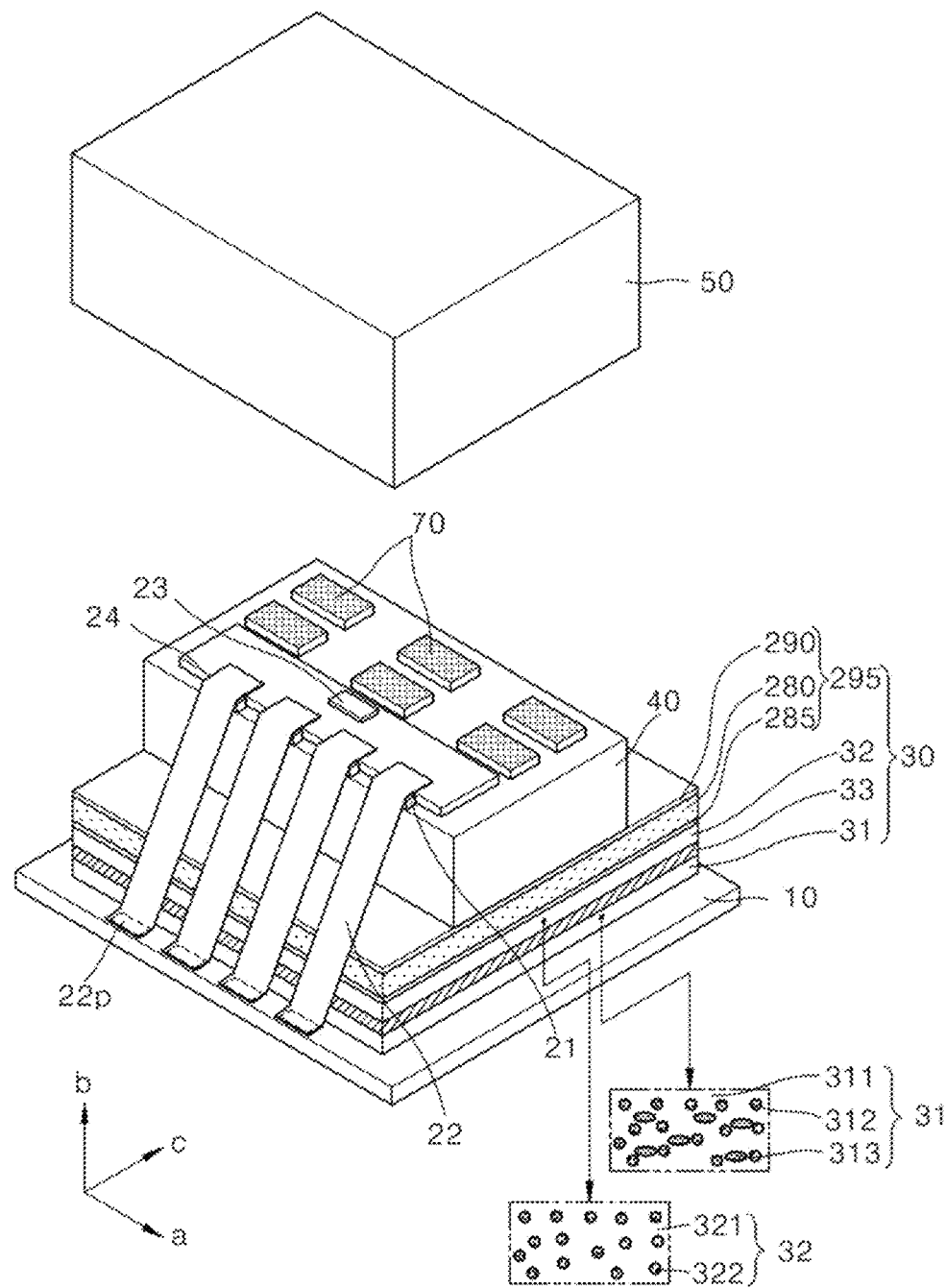
FIG. 20 is a view showing a display device according to a fifth embodiment of the present disclosure.
Figures 21, 22:
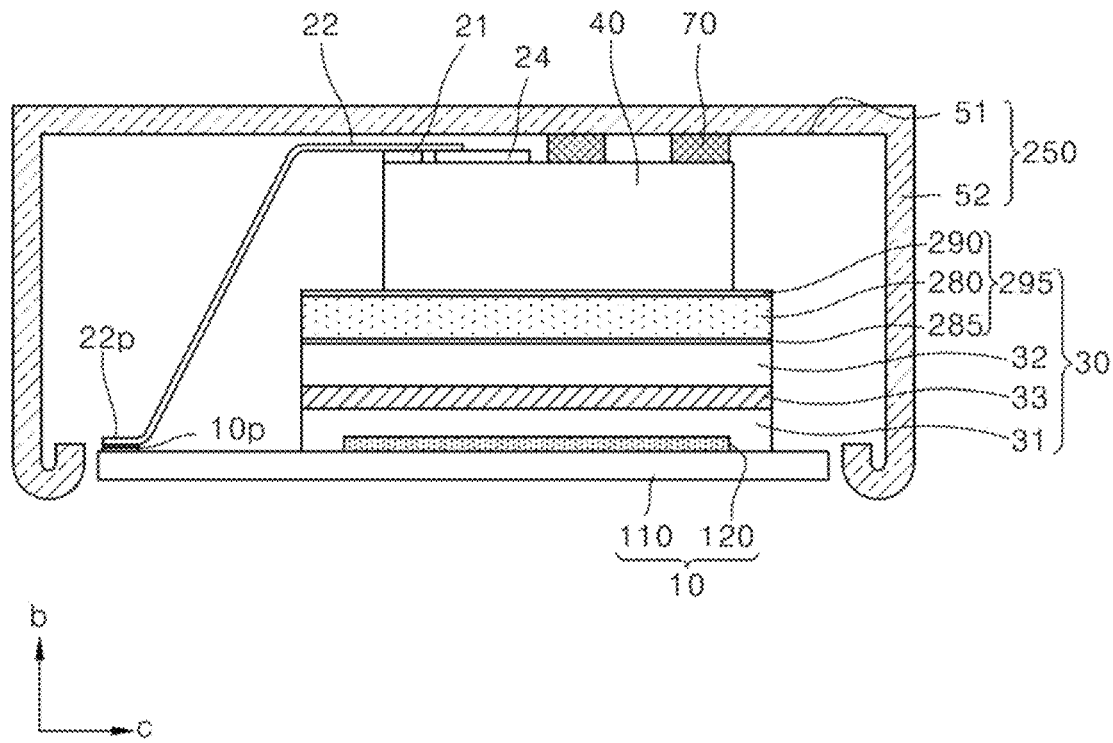
FIG. 21 is a view showing an example of a cb plane cross section of FIG. 20.
FIG. 22 is a table showing a result of evaluation of rigidity of a display device based on change in a thickness of a protective layer.

FIG. 20 is a view showing a display device according to a fifth embodiment of the present disclosure. FIG. 21 is a view showing an example of a cb cross-section of FIG. 20. In this connection, only components different from those of the embodiments described above will be described.

Referring to FIG. 20, in the display device according to the fifth embodiment of the present disclosure, a sealing structure 30 can further include a protective structure 295. The protective structure 295 is disposed on the second adhesive layer 32 and can include one face facing toward the reinforcing substrate 40 and the other face opposite to the one face and facing toward the second adhesive layer 32. The protective structure 295 can constitute a topmost portion of the sealing structure 30. The protective structure 295 comprises a protective layer 280, an antistatic coating film 290 and an adhesive reinforcement film 285. The protective layer 280 of the protective structure 295 can be made of an insulating material including polyethylene terephthalate (hereinafter referred to as PET).

The protective structure 295 is disposed on the second adhesive layer 32 to further secure the rigidity of the display device. The rigidity can refer to a property of an object that the object resists deformation in shape or volume when being subjected to a force. When the protective structure 295 is further included in the sealing structure 30, the array substrate 10 having the light-emitting array 120 disposed thereunder can be prevented from being damaged when a shock is applied to the display device from an outside. In addition, in view of bonding the array substrate 10 and the reinforcing substrate 40 to each other, and maintaining the bonding therebetween, the warpage amount of the display panel can be reduced due to deformation compensation effect resulting from the physical properties and inherent properties of the protective layer 280 of the protective structure 295. In this connection, the protective layer 280 can be referred to as a bonding reinforcement rigid layer.

The antistatic coating film 290 of the protective structure 295 formed via antistatic treatment can be disposed on one face of the protective layer 280 facing toward the reinforcing substrate 40. The adhesive reinforcement film 285 formed via release treatment can be disposed on the other face thereof facing toward the second adhesive layer 32.

The protective layer 280 is composed of PET as an insulator, and PET has a higher sheet resistance than $10^{11}\Omega$/sq, and thus has high electrostatic attraction. Thus, when transferring the sealing structure including the protective layer 280, two or more sealing structures can not be removed from each other or can fall down resulting damages during a transferring process. Further, as PET has the high electrostatic attraction, static electricity can be generated, which can cause a defect on the display device.

Accordingly, the antistatic coating film 290 formed by the antistatic treatment of coating a conductive material on one face of the protective layer 280 can reduce an amount of static electricity as generated. When forming the antistatic coating film 290, the protective layer 280 can have sheet resistance having static dissipation properties. For example, the protective layer 280 on which the antistatic coating film 290 is formed has a sheet resistance value in the range of $10^5$ to $10^{10}\Omega$/sq. The antistatic coating layer 290 can be formed by applying a conductive material having adhesiveness on the protective layer 280. In one embodiment, the antistatic coating layer 290 can include a conductive adhesive.

In addition, the adhesive reinforcement film 285 formed on the other face of the protective layer 280 can be composed of a silicone coating film. By configuring the second adhesive layer 32 to include a polymer material which does not containing a carboxyl group and disposing the adhesive reinforcement film 285 on the other surface of the protective layer 280, an adhesive force between the protective structure 295 and the second adhesive layer 32 can be improved.

Since the second adhesive layer 32 includes a polymer material that does not include a carboxyl group, an adhesive force with the adhesive reinforcement film 285 formed on the other surface of the protective layer 280 can be improved. For example, when the adhesive reinforcement film 285 is removed from the protective layer 280 while the second adhesive layer 232 is made of an olefin-based polymer material that does not contain a carboxyl group, the adhesive force between the protective layer 280 and the second adhesive layers 32 can be reduced. Accordingly, by disposing the adhesive reinforcement film 285 between the protective layer 280 and the second adhesive layer 32, the adhesive force between the protective layer 280 and the second adhesive layer 32 can be maintained.

A thickness of the protective layer 280 to further secure the rigidity of the display device is preferably larger than 30 µm and smaller than 100 µm, approximately.

For example, in order to improve implementation of the narrow bezel, the reinforcing substrate 40 is spaced apart by a minimum spacing from one side edge ed3 of the array substrate 10 toward the light-emitting array 120. The reinforcing substrate 40 can be disposed to overlap the boundary between the display area AA and the non-display area NA.

In one example, the sealing structure 30 and the reinforcing substrate 40 can be sequentially stacked on the opposite face to a light emitting face of the array substrate 10, for example, on a non-light-emitting face thereof. Accordingly, the array substrate 10, the sealing structure 30 having the protective layer 280 of the protective structure 295, and the reinforcing substrate 40 are arranged to have a stepped shape. A bottommost layer of the stepped shape constitutes an area where a portion of the non-display area NA which is the non-light-emitting face of the array substrate 10, is exposed. A middle layer thereof constitutes an area where a portion of a top face of the protective layer 280 of the sealing structure 30 is exposed. A topmost layer thereof constitutes an area where a top face of the reinforcing substrate 40 is exposed. In one example, the display device can have a stepped shape when viewed toward each of four side faces of the array substrate 10.

In one example, as a thickness of the protective layer 280 constituting the sealing structure 30 increases, the rigidity of the display device increases and thus the damage to the panel can be prevented. Hereinafter, this will be described with reference to the drawings.

FIG. 22 is a table showing a rigidity evaluation result of the display device based on thickness change of the protective layer. FIG. 23a to FIG. 23f are photographs showing a dent of the reinforcing substrate and a dark spot generated on a panel during rigidity evaluation.

In the rigidity evaluation of the display device, a constant force, for example, a force in a range of 1 kgf to 5 kgf is applied to an exposed surface of the reinforcing substrate 40 using test equipment for rigidity evaluation for 30 seconds. Then, whether a defect has occurred based on an identifying result of whether a dark spot has been generated on the panel. The test equipment for rigidity evaluation was a push-pull gauge device having a pointed tip.

In this connection, a comparative example employed Invar as a material of the reinforcing substrate and was free of the barrier layer, the second adhesive layer and the protective layer. In a first experimental example to a fifth experimental example, aluminum (Al) was used as a material of the reinforcing substrate, and a structure in which the protective layer 280 was disposed on the second adhesive layer 32 was evaluated. In this connection, in the first experimental example to the third experimental example, a thickness of the second adhesive layer 32 was changed while a thickness of the protective layer 280 was fixed. In the fourth experimental example and the fifth experimental example, the thickness of the second adhesive layer 32 is fixed, while the thickness of the protective layer 280 was changed.

Specifically, in the first experimental example, the thickness of the second adhesive layer 32 was 50 µm, and the thickness of the protective layer 280 was 75 µm. In the second experimental example, the thickness of the second adhesive layer 32 was set to 30 µm, and the thickness of the protective layer 280 was set to 75 µm. In the third experimental example, the thickness of the second adhesive layer 32 was 15 µm, and the thickness of the protective layer 280 was 75 µm. In the fourth experimental example, the thickness of the second adhesive layer 32 was 50 µm, and the thickness of the protective layer 280 was 100 µm. In the fifth experimental example, the thickness of the second adhesive layer 32 was set to 50 µm, and the thickness of the protective layer 280 was set to 38 µm.

Figure 23A:
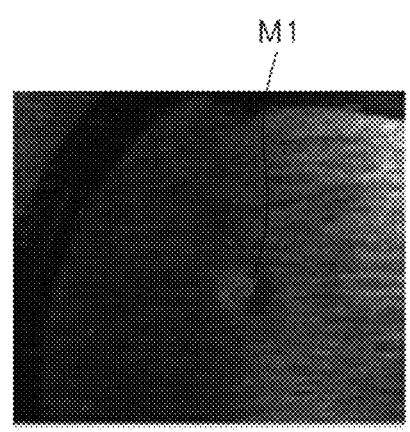
FIG. 23a to FIG. 23f are photographs showing dents on a reinforcing substrate and dark spots generated on a panel during rigidity evaluation.
Figure 23B:
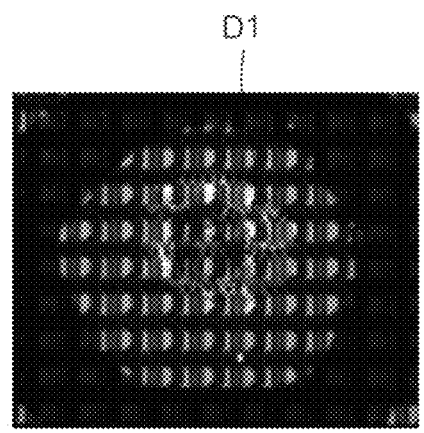

Based on a result of the rigidity evaluation, as shown in the table of FIG. 22, it can be identified that in the comparative example, the dark spot due to the dent did not occur in application of the force of the range of 1 kgf to 4 kgf, but when a force of 5 kgf was applied thereto, the dark spot due to the dent occurred. This can be identified in FIG. 23b which shows the dark spot generated on the panel. Referring to FIG. 23a which shows a surface of the reinforcing substrate and FIG. 23b which shows the pixels of the panel in the rigidity evaluation under application of the force of 5 kgf in the comparative example, it can be identified that when a dent mark M1 appears on the surface of the reinforcing substrate, the dark spot defect D1 appears on the pixel of the panel.

Figure 23C:
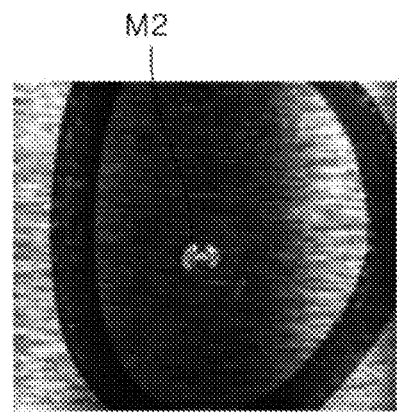
Figure 23D:
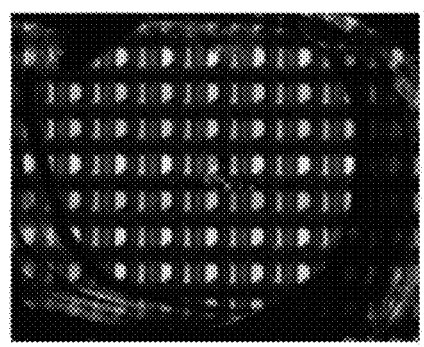
Figure 23E:
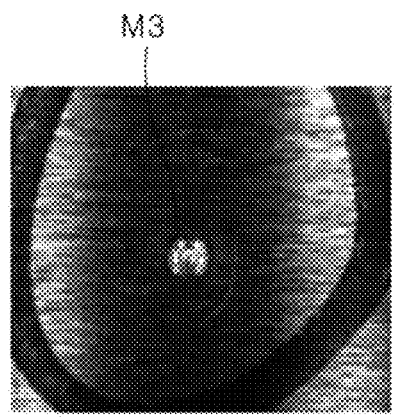
Figure 23F:
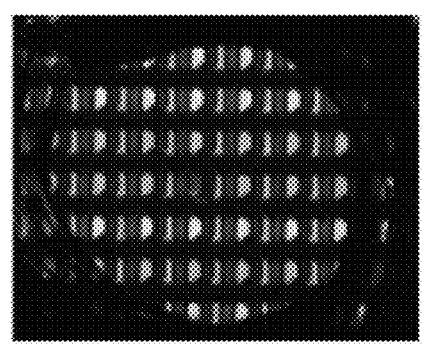

To the contrary, in the first to fourth experimental examples, no defects occurred under application of the force of an entire range of 1 kgf to 5 kgf. Specifically, referring to FIG. 23c and FIG. 23e showing the surface of the reinforcing substrate in the rigidity evaluation under application of the force of 4 kgf and 5 kgf in the third example, respectively, and referring to in FIG. 23d and FIG. 23f showing the pixels of the panel in the rigidity evaluation under application of the force of 4 kgf and 5 kgf in the third example, respectively, it can be identified that although dent marks M2 and M3 occurred on the surface of the reinforcing substrate, no dark spot defects occurred on the pixels of the panel.

Further, in the fifth experimental example in which the thickness of the second adhesive layer 32 was the same as that in the first experimental example but the thickness of the protective layer 280 was relatively smaller and was 38 µm, defects occurred.

From the above evaluation results, it can be identified that when the protective layer 280 is disposed on the second adhesive layer 32, the underlying structure can be protected from external impact. In particular, it can be identified that as the thickness of the protective layer 280 is larger, the greater rigidity can be secured. Thus, damage to the light-emitting array 120 on the array substrate 10 can be prevented in the event of an external shock to the display device.

In one example, it is preferable that the thickness of the protective layer 280 is large to secure the rigidity of the display device. However, when the thickness exceeds the critical thickness, the warpage amount increases due to a difference between coefficients of thermal expansion of the structures constituting the display device, thereby damaging the display device. Accordingly, it is desirable that the thickness of the protective layer 280 does not exceed the critical thickness. Hereinafter, this will be described with reference to the drawings.

FIG. 24 is a table showing an amount of warpage of a panel according to the change in the thickness of the protective layer.

To measure the amount of the warpage of the panel, a temperature of a process chamber was raised to 70 degrees C., and then the amount of warpage of the panel was measured at room temperature. The amount of warpage of the panel can be measured by placing the array substrate 10 of the panel such that the array substrate 10 faces toward a surface of a stone surface plate for inspection and measuring an amount of warpage at each of four edges of the panel using a warpage amount measurer.

Referring to FIG. 24, in the first experimental example to the third experimental example, the thickness of the second adhesive layer 32 was constant and was 50 µm. The thickness of the protective layer 280 was 38 µm in the first experimental example, was 75 µm in the second experimental example, and was 100 µm in the third experimental example. Under these conditions, the amount of warpage of the panel was measured.

Referring to the results of the first experimental example to the third experimental example, an initial warpage amount before being inputted into the process chamber was zero in the first experimental example to the third experimental example.

To the contrary, based on a result of measuring the amount of warpage of the panel after raising the temperature of the process chamber to 70 degrees C., it can be identified that in the first experimental example in which the thickness of the protective layer 280 is relatively smaller, the warpage amount is in a range of 2.5 mm to 6 mm, while as the thickness of the protective layer 280 increases, the warpage amount increases (in the second experimental example), and, further, in the third experimental example in which the thickness of the protective layer 280 is relatively larger, the panel is damaged.

Based on these measurement results, it is preferable that the thickness of the protective layer 280 is large in order to secure the rigidity of the display device, but the panel can be damaged when the thickness exceeds the critical thickness. Thus, it is desirable to limit the thickness of the protective layer 280 so as not to exceed the critical thickness. In one example, the protective layer 280 is preferably formed to have a thickness of 38 µm to 75 µm as the critical thickness at which the panel can be prevented from being bent and damaged while the rigidity of the display device can be secured.

Further, according to the display device according to an embodiment of the present disclosure, the sealing structure 30 can be formed in the multi-layer structure, and the reinforcing substrate 40 can be disposed on the sealing structure 30 having the multi-layer structure. In this case, the warpage amount by which the display device is bent can be reduced, compared to a case in which the sealing structure is formed in a single layer structure, and the reinforcing substrate is disposed on the sealing structure. Hereinafter, this will be described with reference to FIG. 25. In this connection, as in the first embodiment, the reinforcing substrate 40 can be referred to as a bonding substrate, and the sealing structure 30 can be referred to as a bonding structure.

Figure 25:
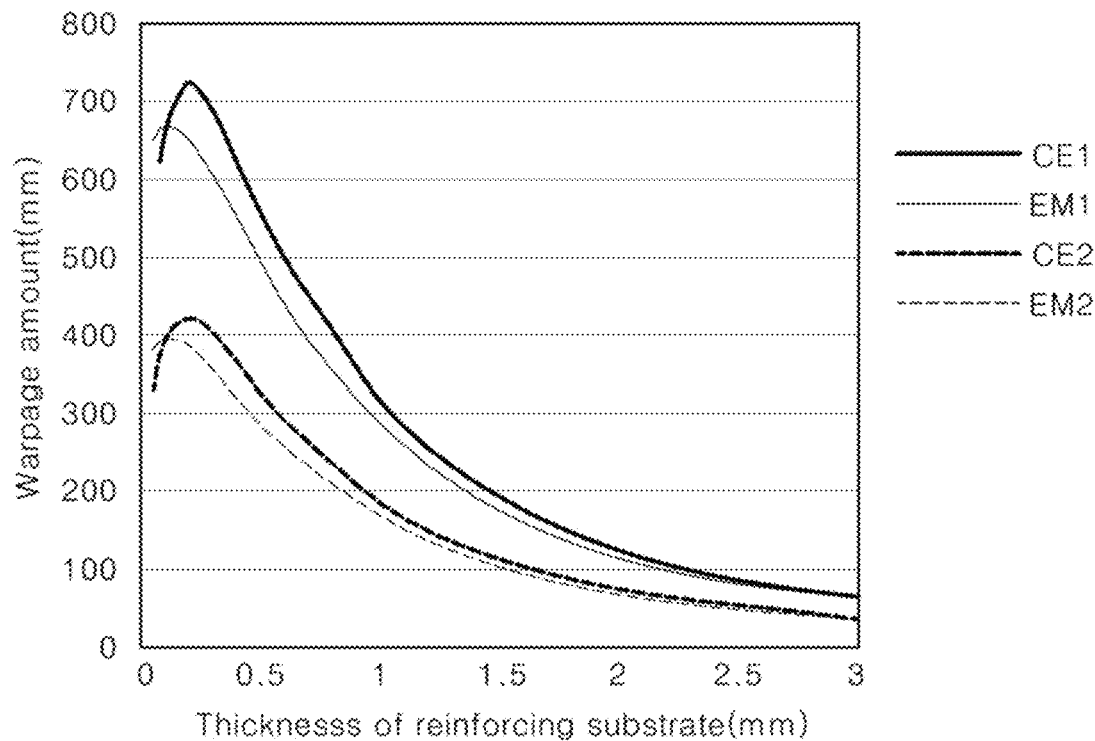
FIG. 25 is a graph showing change in an amount of warpage of the panel based on a configuration of the sealing structure.

FIG. 25 is a graph showing change in the warpage amount of the panel based on a configuration of the sealing structure.

Referring to FIG. 25, a graph of a comparative example 1 CE1 is a graph showing the amount of warpage of the panel in which an adhesive layer as a single layer and the reinforcing substrate 40 are disposed on the array substrate 10, and the temperature of the process chamber is set to 85 degrees C. A graph of a comparative example 2 CE2 is a graph showing the amount of warpage of the panel in which an adhesive layer as a single layer and the reinforcing substrate 40 are disposed on the array substrate 10, and the temperature of the process chamber is set to 60 degrees C.

A graph of Example 1 EM1 is a graph showing the amount of warpage of the panel in which the sealing structure 30 composed of a multilayer structure and the reinforcing substrate 40 are disposed on the array substrate 10, and the temperature of the process chamber is set to 85 degrees C. A graph of Example 2 EM2 is a graph showing the amount of warpage of the panel in which the sealing structure 30 composed of a multilayer structure and the reinforcing substrate 40 are disposed on the array substrate 10, and the temperature of the process chamber is set to 60 degrees C. In this connection, the sealing structure 30 composed of the multilayer structure can have a stack structure in which the first adhesive layer 31, the barrier layer 33, and the second adhesive layer 32 are stacked. The protective layer 280 can be added thereto. Further, the barrier layer 33 can be made of an aluminum (Al)-based metal material, and the reinforcing substrate 40 can be made of an aluminum (Al)-based metal material.

The amount of warpage of the panel can be measured by placing the array substrate 10 of the panel such that the array substrate 10 faces toward a surface of a stone surface plate for inspection and measuring an amount of warpage at each of four edges of the panel using a warpage amount measurer.

Referring to the comparative examples CE1 and CE2 and the examples EM1 and EM2, it can be identified that when the test proceeds at the same temperature, the warpage amount of the panel in each of the examples EM1 and EM2 to which the sealing structure 30 composed of a multilayer structure is applied is smaller than the warpage amount of the panel in the comparative examples CE1 and CE2 to which a single layer as the adhesive layer is applied to.

In particular, it can be identified that when the temperature of the process chamber is lowered to 60 degrees C. lower than 85 degrees C., the warpage amount further decreases to a level of 58% of that when the temperature of the process chamber is 85 degrees C.

Further, it can be identified that the warpage amount decreases as the thickness of the reinforcing substrate 40 becomes larger. For example, it can be identified that when the sealing structure 30 composed of a multilayer structure and the reinforcing substrate 40 are disposed on the array substrate 10, and the thickness of the reinforcing substrate 40 is 0.1 mm in Example 2 EM2 where the temperature of the process chamber is 60 degrees C., the warpage amount is approximate to 400 mm. It can be identified that when the sealing structure 30 composed of a multilayer structure and the reinforcing substrate 40 are disposed on the array substrate 10, and the thickness of the reinforcing substrate 40 is 1 mm in Example 2 EM2 where the temperature of the process chamber is 60 degrees C., the warpage amount is smaller than 200 mm and thus is reduced by 50% or greater of the warpage amount when the thickness of the reinforcing substrate 40 is 0.1 mm.

Based on the graph of this experimental example, it can be identified that when the thickness of the reinforcing substrate 40 is larger while the sealing structure 30 is composed of a multi-layer structure, the warpage amount by which the display device is bent is smaller than that when the sealing structure is composed of a single layer while the thickness of the reinforcing substrate 40 is larger.

Further, according to the display device according to an embodiment of the present disclosure, as the thickness of the sealing structure 30 is larger, the warpage amount by which the panel is bent can be reduced when the thickness of the reinforcing substrate 40 is constant. Hereinafter, this will be described with reference to FIG. 26 to FIG. 28.

Figure 26:
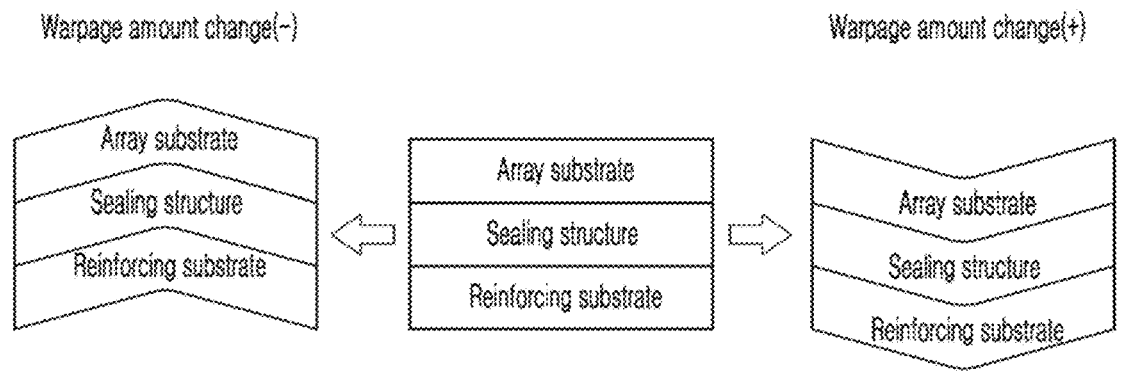
FIG. 26 is a diagram schematically showing change in an amount of a warpage of the panel.
Figure 27:
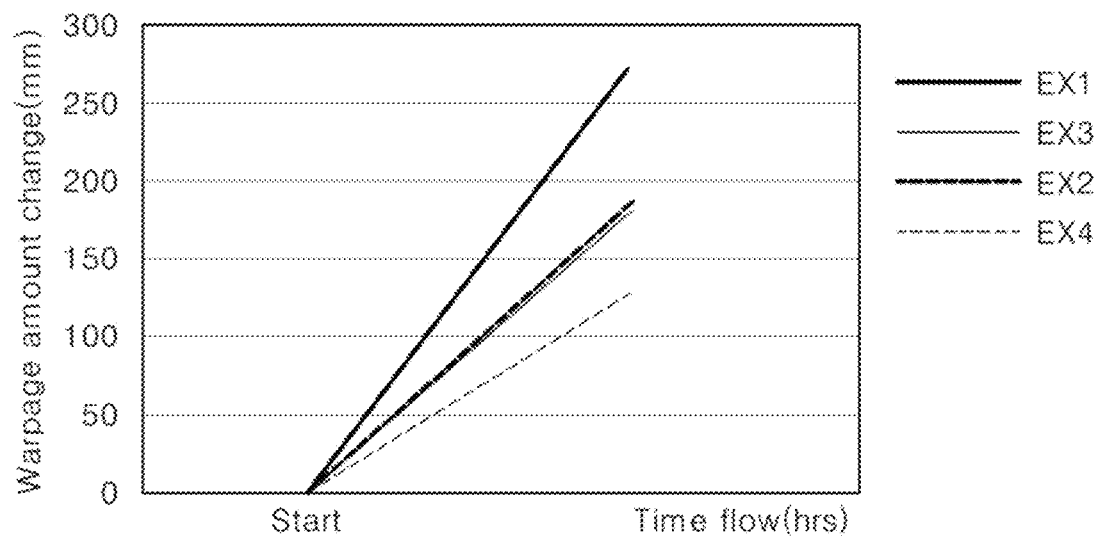
FIG. 27 is a graph showing change in an amount of warpage based on a thickness change of a sealing structure at a high temperature.
Figure 28:
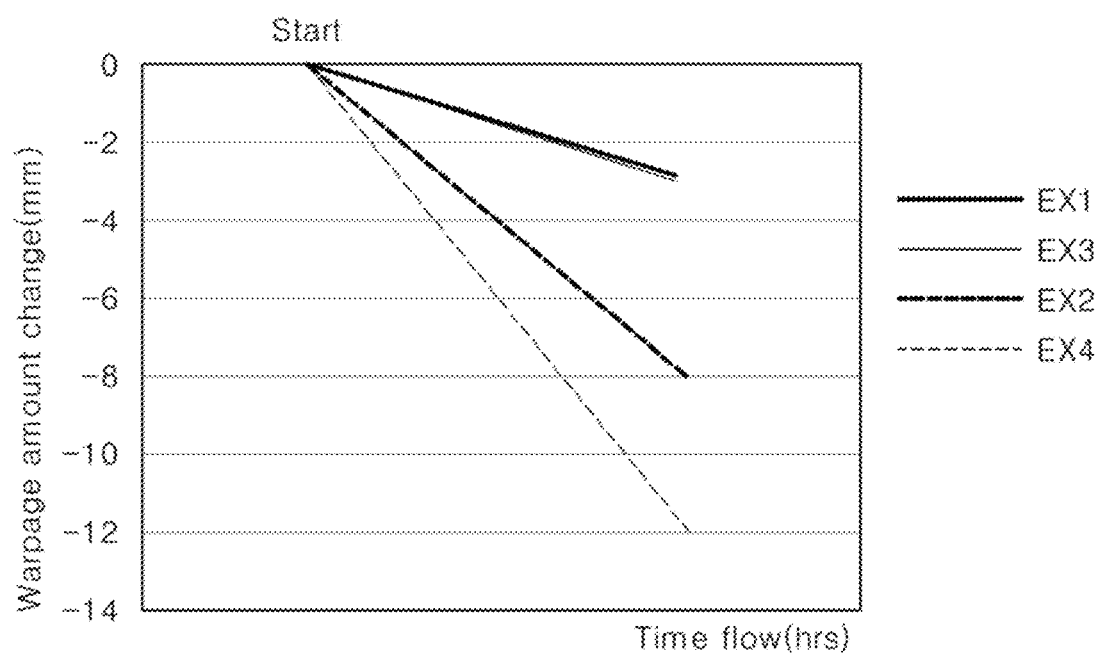
FIG. 28 is a graph showing change in an amount of warpage based on a thickness change of a sealing structure at room temperature.

FIG. 26 is a diagram schematically showing change in the warpage amount of the panel. FIG. 27 is a graph showing warpage amount change based on thickness change of the sealing structure at a high temperature. FIG. 28 is a graph showing the warpage amount change based on the thickness change of the sealing structure at room temperature.

Referring to FIG. 26, the warpage amount change of the panel can be defined as having a negative (−) value when a central portion of the array substrate protrudes convexly. When the central portion of the array substrate is concavely depressed, the warpage amount change can be defined as having a positive (+) value. In this connection, in order to measure the warpage amount change according to the change in the thickness of the sealing structure, a panel structure in which the sealing structure and the reinforcing substrate made of aluminum (Al) are disposed on the array substrate was employed. In one example, the sealing structure can be composed of the first adhesive layer, the barrier layer and the second adhesive layer, or can be composed of the first adhesive layer, the barrier layer, the second adhesive layer and the protective structure.

The warpage amount change was measured by placing the above-described structure into the process chamber, and increasing the temperature of the process chamber to a high temperature, for example, to a temperature of 60 degrees C., and measuring the warpage of the panel, and then maintaining the panel until the panel is flat again, and cooling the temperature of the process chamber to room temperature, and then measuring the warpage of the panel at room temperature.

A panel structure in which the sealing structure and the reinforcing substrate made of an aluminum (Al) are disposed on the array substrate can include a first experimental example EX1 in which a reinforcing substrate having a thickness of 0.6 mm, and a sealing structure having a thickness of 60 μm are disposed on the array substrate, a second experimental example EX2 in which a sealing structure having a thickness of 480 μm and a reinforcing substrate having a thickness of 0.6 mm are disposed on the array substrate, a third experimental example 3 EX3 in which a sealing structure having a 60 μm thickness and a reinforcing substrate having a thickness of 1.0 mm are disposed on the array substrate, and a fourth experimental example EX4 in which a sealing structure having a thickness of 480 μm, and a reinforcing substrate having a thickness of 1.0 mm are disposed on the array substrate.

As shown in FIG. 27 as a graph of a measuring result of the warpage amount change according to the change in the thickness of the sealing structure at high temperature using this measurement method, when comparing the first experimental example EX1 and the second experimental example EX2 with each other, it can be identified that when the reinforcing substrate has a constant thickness, the warpage amount change decreases in the second experimental example EX2 in which the thickness of the sealing structure is larger. Further, it can be identified that the warpage amount change is smaller in the third experimental example EX3 and the fourth experimental example EX4 in which the thickness of the reinforcing substrate is relatively larger than in the first experimental example EX1 and the second experimental example EX2.

Further, referring to FIG. 28 as a graph of a measuring result of the warpage amount change according to the change in the thickness of the sealing structure at room temperature, it can be identified that in the first experimental example EX1 and the second experimental example EX2, the warpage amount change decreases in the negative (−) direction. Further, it can be identified that when the reinforcing substrate has a constant thickness, the warpage amount change decreases in the second experimental example EX2 in which the thickness of the sealing structure becomes larger. Further, it can be identified that the warpage amount change in the third experimental example EX3 and the fourth experimental example EX4 in which the thickness of the reinforcing substrate is relatively larger is smaller than in the first experimental example EX1 and the second experimental example EX2.

The fact that the high-temperature and room-temperature warpage amount decreases in the negative(−) direction can be related to a fact that as a neutral plane is displaced as the thickness of the sealing structure becomes larger, the high temperature warpage amount decreases; and as the thickness of the sealing structure becomes larger, a stress relaxation effect to return to an original flat surface is greater, such that the room temperature warpage amount decreases in the negative direction.

The organic light-emitting display device according to the embodiments of the present disclosure can include the sealing structure composed of a multilayer structure to secure the larger thickness of the reinforcing substrate made of a material with high thermal conductivity, thereby increasing rigidity and improving the heat dissipation effect. Further, because the larger thickness of the reinforcing substrate can be secured, the device can effectively dissipate the heat, thereby reducing the occurrence of afterimages on the panel and improving the lifespan of the display device. Further, introducing the sealing structure composed of a multi-layer structure and placing the reinforcing substrate thereon can result in securing the reliability of fixing the reinforcing substrate when the thickness of the reinforcing substrate is larger, thereby improving the bonding force between the array substrate and the reinforcing substrate. Further, introducing the barrier layer into the sealing structure having the multilayer structure can allow the bonding force between the first adhesive layer and the second adhesive layer to be improved. In addition, introducing the sealing structure having the multi-layer structure can result in reduction of the warpage amount by which the display device is bent. In addition, controlling the thickness of the reinforcing substrate such that the shift offset value of the reinforcing substrate is within the critical range can allow a narrow bezel to be realized while preventing the flexible circuit board from coming into contact with the sealing structure or the reinforcing substrate and thus from being damaged.

Figure 29:
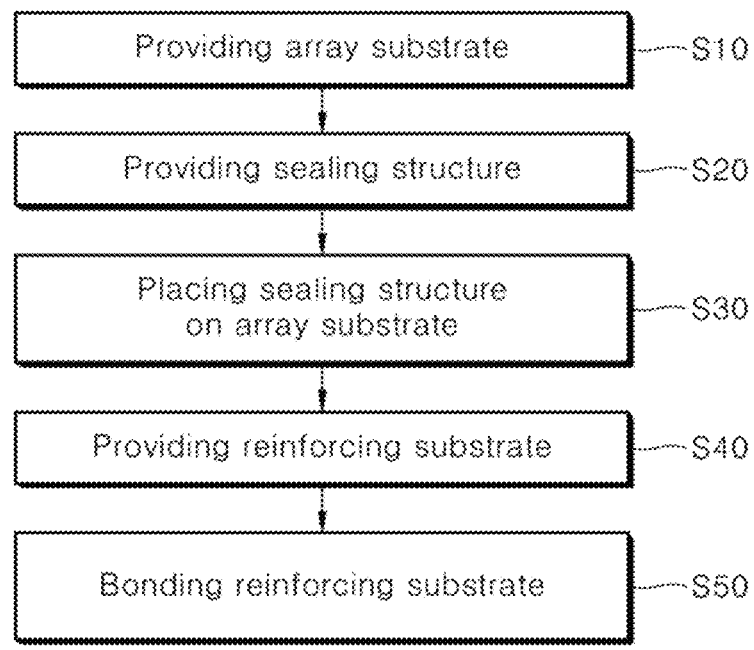
FIG. 29 is a flowchart showing a method for manufacturing a display device according to one embodiment of the present disclosure.

FIG. 29 is a flowchart showing a method for manufacturing a display device according to one embodiment of the present disclosure. FIG. 30 to FIG. 35 are views showing the steps of the method in FIG. 29.

As shown in FIG. 29, a method for manufacturing a display device according to one embodiment of the present disclosure can include a step S10 of preparing the array substrate 10 having the light-emitting array 120 including the plurality of light-emissive elements OLEDs corresponding to the plurality of pixel areas PA, a step S20 of preparing the sealing structure 30 including the first and second adhesive layers 31 and 32 facing toward each other and the barrier layer 33 disposed between the first and second adhesive layers 31 and 32, and a step S30 of disposing the sealing structure 30 on the array substrate 10 such that the light-emitting array 120 is sealed with the first adhesive layer 31. In another example, the sealing structure 30 can further include the protective structure 295 (refer to FIG. 20) on the second adhesive layer 32.

Moreover, the method for manufacturing a display device according to one embodiment of the present disclosure can further include, after the step S30 of disposing the sealing structure 30 on the array substrate 10, a step S40 of preparing the plate-shaped reinforcing substrate 40, and a step S50 of attaching the reinforcing substrate 40 to the second adhesive layer 32.

Figure 30:
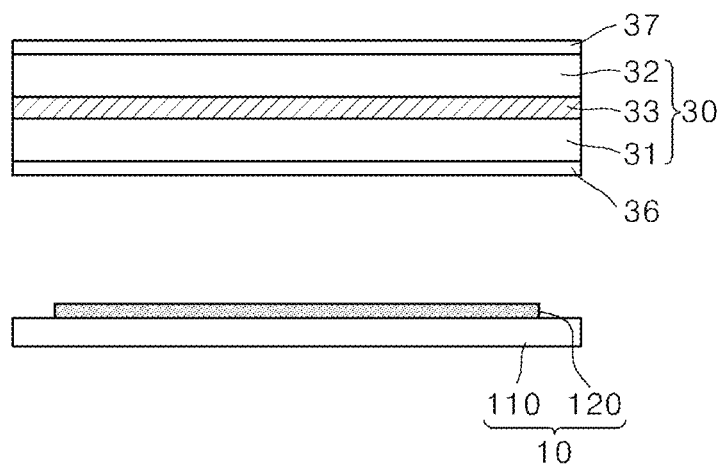
FIG. 30 to FIG. 35 are views showing the steps of the method in FIG. 29.

Specifically, as shown in FIG. 30, the array substrate 10 having the light-emitting array 120 is prepared (S10).

As shown in FIG. 2, the array substrate 10 can include the plurality of pixel areas PA defined in the display area AA, and the gate line GL and the data line DL for supplying the drive signal to the pixel circuit of each pixel area PA.

As shown in FIG. 4, the array substrate 10 can include the transistor array 110 including the plurality of pixel circuits respectively corresponding to the plurality of pixel areas PA, and the light-emitting array 120 including the plurality of organic light-emissive elements OLEDs respectively corresponding to the plurality of pixel areas PA.

In addition, as shown in FIG. 5, the array substrate 10 further includes the pad 10p disposed in a portion of the non-display area NA outside the display area AA.

Then, the sealing structure 30 having a multi-layer structure is prepared (S20).

The sealing structure 30 can include a structure in which the first adhesive layer 31, the barrier layer 33 and the second adhesive layer 32 are sequentially stacked. For example, the sealing structure 30 has a stack structure of the first and second adhesive layers 31 and 32 separated via the barrier layer 33.

Each of the thicknesses 31th and 32th of the first and second adhesive layers 31 and 32, respectively can be selected from a range of 10 μm to 100 μm. In this way, the process defects such as foreign material insertion in each of the first and second adhesive layers 31 and 32 and displacement thereof can be prevented. Thus, the thickness 30th of the sealing structure 30 including the first and second adhesive layers 31 and 32 can be increased.

For example, the thickness 30th of the sealing structure 30 can be within a range of 30 μm to 300 μm.

The first adhesive layer 31 can be made of one polymer material 311 (see FIG. 6) selected from an olefin-based polymer, an epoxy-based polymer, and an acrylate based polymer. The second adhesive layer 32 can be made of any one polymer material 321 (see FIG. 6) selected from among an olefin-based polymer, an epoxy-based polymer, an acrylate based polymer, an amine-based polymer, a phenol-based polymer and acid anhydride-based polymer, and each of which does not contain a carboxyl group.

Each of the first and second adhesive layers 31 and 32 can be composed of each mixture including each of the polymer materials (311 and 321 in FIG. 6) having adhesiveness and each of the particles (312 and 322 in FIG. 6) made of the metal material. In one example, each of the first particles 312 made of the metal material can be a powder made of Ni. In this way, the thermal conductivity of each of the first and second adhesive layers 31 and 32 can be improved, such that the heat dissipation effect due to the sealing structure 30 can be improved. In this connection, unlike the first adhesive layer 31, the second adhesive layer 32 is made of a second adhesive polymer material 321 that does not contain a carboxyl group. In embodiments, sizes of the particles 312 to those of particles 322 can be comparable, but such is not required. An average size of the particles 312 can be greater than that of the particles 322 or vice versa.

Alternatively, the first adhesive layer 31 in contact with the array substrate 10 is made of the mixture including the first polymer material 311 having adhesiveness and the first particles 312 made of the metal material. The second adhesive layer (32 of FIG. 9) can be made of the second polymer material 321 having adhesiveness and free of the carboxyl group. In this way, the adhesiveness of the second adhesive layer 32 can be higher than that of the first adhesive layer 31, and the cost of preparing the sealing structure 30 can be reduced.

In addition, the first adhesive layer 31 can be composed of the mixture further containing the hygroscopic inorganic filler 313. The hygroscopic inorganic filler 313 can be made of at least one of CaO, MgO, or BaO. In this way, the moisture permeation prevention effect due to the first adhesive layer 31 can be improved.

The barrier layer 33 is intended for separating the first and second adhesive layers 31 and 32 from each other and can be embodied as a thin-film made of one of a metal material and an inorganic insulating material. In one example, the barrier layer 33 can be embodied as a thin-film (foil) including a metal material such as Al, Cu, Sn, Ag, Fe, or Zn. Alternatively, the barrier layer 33 can be embodied as a thin-film made of an inorganic insulating material such as $SiO_x$ or $SiON_x$.

The thickness 33th of the barrier layer 33 can be within a range greater than 10 μm and smaller than each of the thicknesses 31th and 32th of the first and second adhesive layers 31 and 32, respectively. In this way, the hole related defect of the barrier layer 33 can be prevented, and the thickness of the sealing structure 30 can be prevented from being unnecessarily increased due to the barrier layer 33.

Alternatively, as shown in FIG. 10, the sealing structure 30 can further include at least one of the first and second auxiliary barrier layers 34 and 35 respectively disposed on both opposing faces of the barrier layer 33 made of the metal material.

In addition, in the step S20 of preparing the sealing structure 30, the sealing structure 30 can be provided in a state in which both opposing faces thereof are respectively covered with first and second temporary cover layers 36 and 37.

For example, in the step S20 of preparing the sealing structure 30, the sealing structure 30 can be provided in a state in which the first adhesive layer 31 of the sealing structure 30 can be covered with the first temporary cover layer 36, while the second adhesive layer 32 can be covered with the second temporary cover layer 37. Each of the first temporary cover layer 36 and the second temporary cover layer 37 can have a release film such as a silicone coating formed on one face thereof facing toward each of the first adhesive layer 31 and the second adhesive layer 32. The release film can allow each of the first temporary cover layer 36 and the second temporary cover layer 37 to be easily removed from the sealing structure 30 in a subsequent process. In addition, an antistatic coating film formed via antistatic treatment can be formed on the opposite face of each of the first temporary cover layer 36 and the second temporary cover layer 37.

In another example, when the protective layer 280 of the protective structure 295 (see FIG. 20) is formed on the second adhesive layer 32 of the sealing structure 30, the adhesive reinforcement film 85 can be formed on one face of the protective layer 280, while the antistatic coating film 290 (see FIG. 20) can be formed on the opposite face thereof.

Subsequently, the step S30 of disposing the sealing structure 30 on the array substrate 10 can include removing the first temporary cover layer 36 from the first adhesive layer 31 of the sealing structure 30, and bringing the first adhesive layer 31 into a close contact state with the array substrate 10 using a roller.

Figure 31:
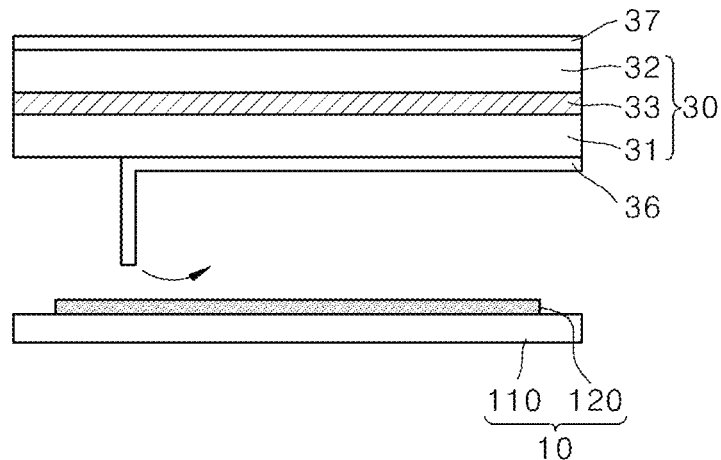

For example, as shown in FIG. 31, the first temporary cover layer 36 can be removed from the sealing structure 30, and thus the first adhesive layer 31 can be exposed.

Figure 32:
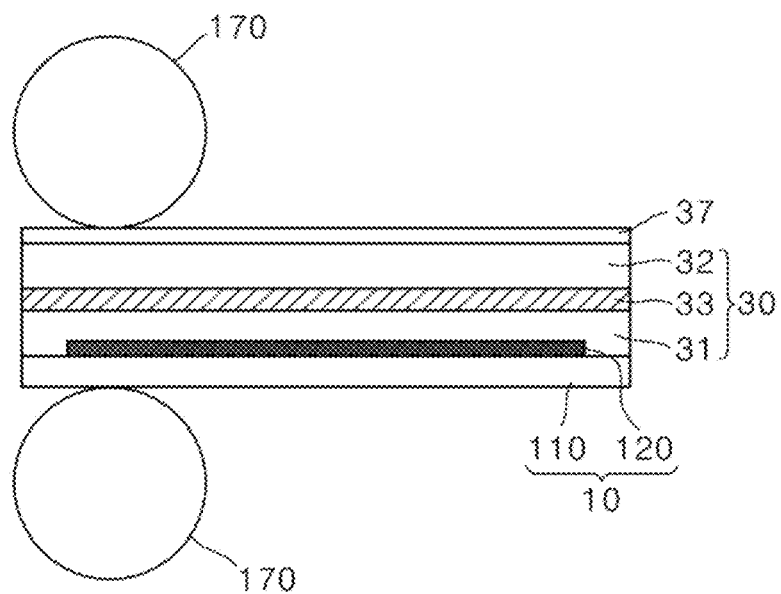

Then, as shown in FIG. 32, while the first adhesive layer 31 of the sealing structure 30 is aligned on the array substrate 10, a predefined pressure is applied to the sealing structure 30 or the array substrate 10 using at least one roller 170. Accordingly, the first adhesive layer 31 of the sealing structure 30 is closely adhered to the array substrate 10.

Figure 33:
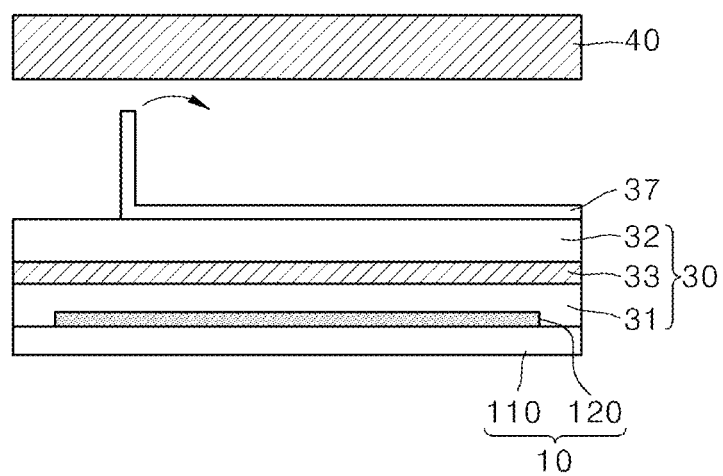

Next, as shown in FIG. 33, the plate-shaped reinforcing substrate 40 is prepared (S40), and then the reinforcing substrate 40 is attached to the sealing structure 30 (S50).

Moreover, the step S50 of attaching the reinforcing substrate 40 to the sealing structure 30 can include removing the second temporary cover layer 37 from the second adhesive layer 32 of the sealing structure 30, and attaching the reinforcing substrate 40 to the second adhesive layer 32.

In the step S40 of preparing the plate-shaped reinforcing substrate 40, the reinforcing substrate 40 can be made of one material among glass, metal, and plastic polymer. According to the increased thickness of the sealing structure 30, the thickness 40$th$ of the reinforcing substrate 40 can be within a range of 0.1 mm to 1.5 mm.

As shown in FIG. 33, the second temporary cover layer 37 can be removed from the sealing structure 30 attached to the array substrate 10, and the second adhesive layer 32 can be exposed.

In another example, when the protective structure 295 (refer to FIG. 20) is further disposed on the second adhesive layer 32 of the sealing structure 30, a top surface of the protective structure 295 can be exposed.

Figure 34:
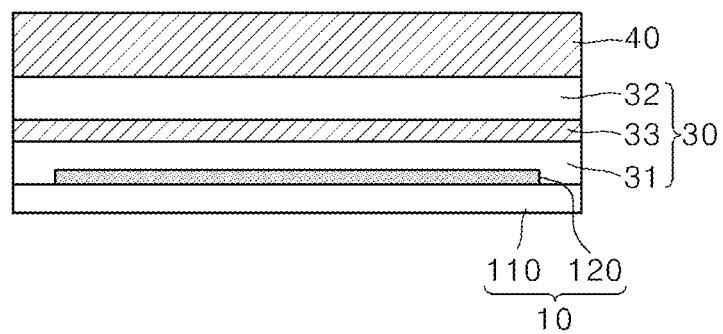

Moreover, as shown in FIG. 34, the reinforcing substrate 40 is attached to the second adhesive layer 32 of the sealing structure 30 (S50). Thus, the reinforcing substrate 40 is coupled to the array substrate 10 via the sealing structure 30.

According to one embodiment of the present disclosure, the rigidity achieved by the reinforcing substrate 40 can be secured to have a level that can maintain the shape of the array substrate. Thus, an intermediate process structure in a state in which the array substrate 10 and the reinforcing substrate 40 are coupled to each other can be transferred to another location. Accordingly, a cell device that does not include the bottom cover 50 for accommodating the array substrate 10 and the reinforcing substrate 40 can be provided. Thus, an application range can be enlarged.

Alternatively, a module device including the bottom cover 50 accommodating the array substrate 10 and the reinforcing substrate 40 can be provided. A process of preparing the module device is as follows.

Figure 35:
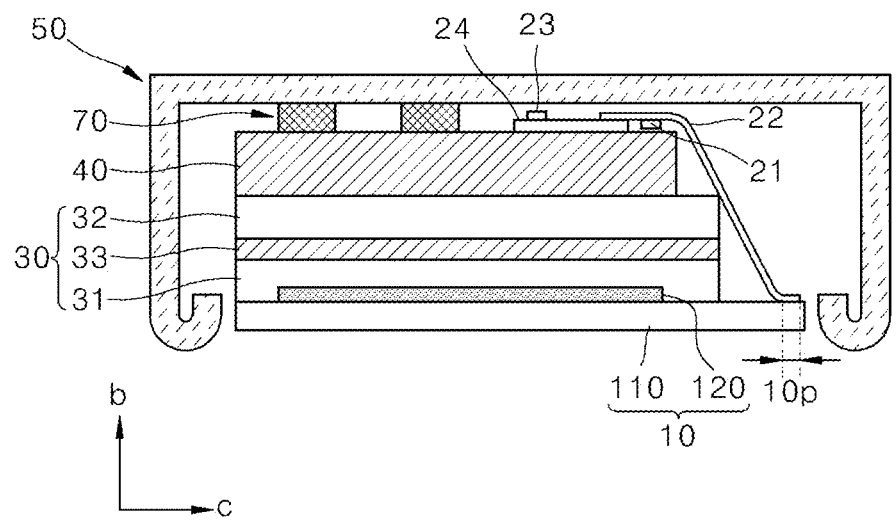
Figure 36:
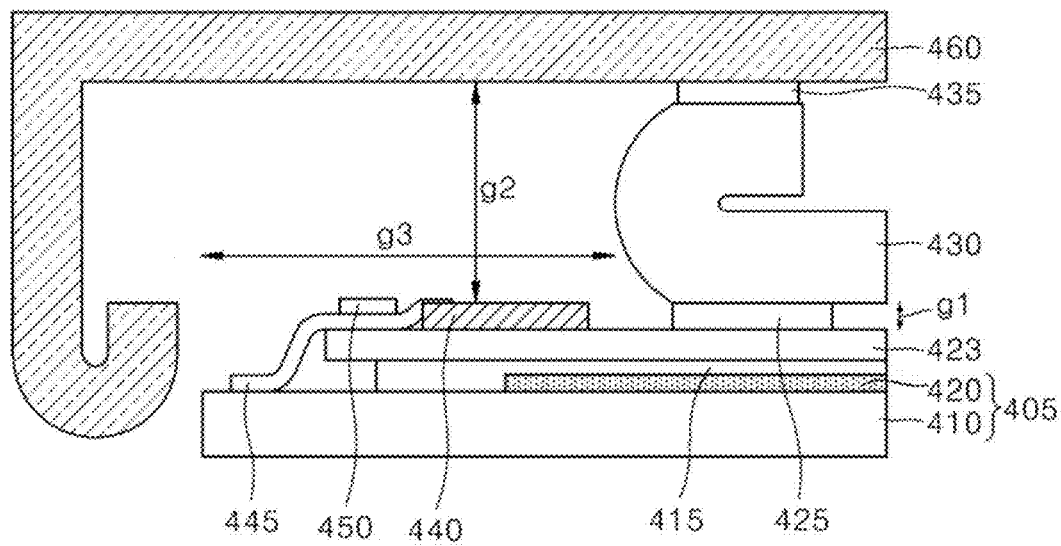
FIG. 36 is a view of a display device according to a related art.

As shown in FIG. 35, the at least one flexible circuit board 22 is connected to the array substrate 10. The printed circuit board 24 connected to the at least one flexible circuit board 22 is disposed on the reinforcing substrate 40.

In this connection, the reinforcing substrate 40 is disposed further away from the pad 10$p$ of the array substrate 10 than the sealing structure 30 is. Therefore, each flexible circuit board 22 can extend over and across the sealing structure 30 rather than the reinforcing substrate 40.

Moreover, the bottom cover 50 accommodates therein the array substrate 10, the sealing structure 30, the reinforcing substrate 40, the at least one flexible circuit board 22 and the printed circuit board 24, and is bound to the reinforcing substrate 40 via the at least one adhesive pattern 70 disposed on the reinforcing substrate 40.

As described above, the display device according to each embodiment of the present disclosure can include the sealing structure 30 having a stack structure of the first and second adhesive layers 31 and 32 while the barrier layer 33 is interposed therebetween. Thus, the sealing structure 30 can have a relatively larger thickness due to the stack structure of the first and second adhesive layers 31 and 32. For example, the thickness 30$th$ of the sealing structure 30 can be about twice a critical thickness to prevent the process defect in a single layer made of the adhesive material.

Accordingly, the reinforcing substrate 40 which can be fixed to the array substrate 10 via the sealing structure 30 can have a relatively larger thickness. Therefore, the rigidity and the heat dissipation effect due to the reinforcing substrate 40 can be sufficiently secured and the inner plate can be unnecessary. In other words, the inner plate can be removed. This can be advantageous for slimming and lightening of the display device.

In addition, implementing the sealing structure having a multi-layered structure can result in reducing the warpage amount by which the display device is bent.

In addition, the heat can be effectively dissipated by using a material having high thermal conductivity as the material of the reinforcing substrate. Thus, the occurrence of after-images on the panel can be reduced and the lifespan of the light emitting array can be improved.

In addition, adjusting the thickness of the reinforcing substrate to displace the position of the reinforcing substrate can allow preventing the flexible printed circuit board from coming into contact with the sealing structure or the reinforcing board and preventing damage to the flexible printed circuit board. The optimal arrangement of the reinforcing substrate can maximize the implementation of the narrow bezel of the display panel while increasing the heat dissipation effect in the pad area where the temperature is relatively higher.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
   an array substrate having a base substrate including a display area and a non-display area disposed adjacent to the display area, and a light-emitting array, the light-emitting array including a plurality of light-emissive elements respectively corresponding to a plurality of pixel areas in the display area, wherein the light-emitting array further includes a first side facing toward the base substrate and a second side opposite to the first side;
   a plate-shaped reinforcing substrate disposed in a direction of the second side of the light-emitting array; and a sealing structure disposed on the array substrate to seal the light-emitting array, and configured to fix the plate-shaped reinforcing substrate to the array substrate,
wherein the sealing structure includes:
a first adhesive layer surrounding the second side and both edge sides of the light-emitting array;
a second adhesive layer facing toward the reinforcing substrate; and
a barrier layer disposed between the first and second adhesive layers, and
wherein the barrier layer is made of a metal material, and the metal material includes a metal material selected from Al, Cu, Sn, Ag, Fe, Zn, or an alloy thereof.

2. The display device of claim 1, wherein the first adhesive layer is made of a polymer material selected from a group consisting of an olefin-based polymer, an epoxy-based polymer, and an acrylate-based polymer, and a mixture containing particles made of a metal material and an inorganic filler made of at least one selected from CaO, MgO, and BaO, and
wherein the second adhesive layer is made of a polymer material free of a carboxyl group.

3. The display device of claim 1, wherein the barrier layer is made of the metal material having an elongation of greater than approximately 4% and a yield strength value smaller than approximately 360 Mpa.

4. The display device of claim 1, wherein the barrier layer is made of an inorganic insulating material including silicon oxide (SiOx) or silicon oxynitride (SiONx).

5. The display device of claim 1, wherein the sealing structure further includes a protective structure facing toward the reinforcing substrate and positioned between the second adhesive layer and the reinforcing substrate, and
wherein the protective structure comprises a protective layer, an adhesive reinforcement film on one face thereof facing toward the second adhesive layer while on another face thereof facing toward one face of the protective layer, and an antistatic coating film on one face thereof facing toward the other face of the protective layer while on another face thereof facing toward the reinforcing substrate is disposed.

6. The display device of claim 5, wherein the antistatic coating film allows a sheet resistance of the protective layer to be maintained at approximately 1010 Ω/sq.

7. The display device of claim 1, wherein the sealing structure further includes at least one of:
a first auxiliary barrier layer disposed between the first adhesive layer and the barrier layer and made of an inorganic insulating material; and
a second auxiliary barrier layer disposed between the second adhesive layer and the barrier layer and made of the inorganic insulating material.

8. The display device of claim 1, wherein the barrier layer has a structure in which a first metal film and a second metal film respectively including different metal materials are stacked sequentially.

9. The display device of claim 1, wherein the barrier layer has a structure in which a first inorganic insulating film and a second inorganic insulating film respectively including different inorganic insulating materials are stacked sequentially.

10. The display device of claim 1, further comprising:
a printed circuit board disposed on the reinforcing substrate;
at least one flexible circuit board having one side connected to the printed circuit board and another side connected to a pad disposed in the non-display area of the array substrate; and
a bottom cover configured to accommodate therein the array substrate, the sealing structure, the reinforcing substrate, the at least one flexible circuit board, and the printed circuit board, and coupled to the reinforcing substrate,
wherein the printed circuit board is disposed between the reinforcing substrate and the bottom cover.

11. The display device of claim 10, wherein one side edge of the sealing structure adjacent to the pad of the array substrate is spaced apart from the pad of the array substrate by a first spacing;
wherein one side edge of the reinforcing substrate adjacent to the pad of the array substrate is spaced apart from the pad of the array substrate by a second spacing greater than the first spacing, and
wherein the reinforcing substrate has a width smaller than a width of the sealing structure so that a portion of a topmost surface of the sealing structure is exposed.

12. The display device of claim 11, wherein when a thickness of the reinforcing substrate increases, the second spacing by which the reinforcing substrate is spaced apart from one side edge of the sealing structure increases, and
wherein the reinforcing substrate is disposed inwardly from one side edge of the sealing structure.

13. The display device of claim 1, wherein the array substrate, the sealing structure and the reinforcing substrate are sequentially stacked to form a stepped shape at at least one side of a stack, and
wherein the stepped shape has:
a lower portion as an exposed portion of the non-display area of the array substrate;
a middle portion as an exposed portion of a top face of the sealing structure; and
an upper portion as an exposed top face of the reinforcing substrate.

14. The display device of claim 13, wherein the top face of the sealing structure is a top face of the second adhesive layer or a top face of a protective structure of the sealing structure disposed on the second adhesive layer.

15. The display device of claim 10, wherein the bottom cover is coupled to the reinforcing substrate via at least one adhesive pattern disposed between the reinforcing substrate and the bottom cover.

16. A display device comprising:
an array substrate having a display area, a non-display area disposed adjacent to the display area, and a light-emitting array, the light-emitting array including a plurality of light-emissive elements respectively corresponding to a plurality of pixel areas in the display area;
a sealing structure disposed on the array substrate to seal the light-emitting array, and configured to fix a plate-shaped reinforcing substrate facing toward the array substrate, the sealing structure having a multi-layer structure;
a printed circuit board disposed on the reinforcing substrate;
at least one flexible circuit board having one side connected to the printed circuit board and another side connected to a pad disposed in the non-display area of the array substrate; and
a bottom cover configured to accommodate therein the array substrate, the sealing structure, the reinforcing substrate, the at least one flexible circuit board, and the printed circuit board, and coupled to the reinforcing substrate, wherein at least one layer of the multi-layer structure includes a metal component, and wherein the printed circuit board is disposed between the reinforcing board and the bottom cover.

17. The display device of claim 16, wherein the sealing structure includes:

a first adhesive layer facing toward the array substrate;

a second adhesive layer facing toward the reinforcing substrate; and a barrier layer disposed between the first and second adhesive layers, and wherein at least one of the first adhesive layer, the second adhesive layer, and the barrier layer includes the metal component.

18. The display device of claim 16, wherein the first adhesive layer is made of a polymer material selected from a group consisting of an olefin-based polymer, an epoxy-based polymer, and an acrylate-based polymer, and a mixture further containing particles made of a metal material and an inorganic filler made of at least one selected from CaO, MgO, and BaO, and wherein the second adhesive layer is made of a polymer material free of a carboxyl group.

19. The display device of claim 16, wherein the barrier layer is made of a metal material having an elongation of greater than approximately 4% and a yield strength value smaller than approximately 360 Mpa.

20. The display device of claim 16, wherein the barrier layer is made of an inorganic insulating material including silicon oxide (SiOx) or silicon oxynitride (SiONx).

\* \* \* \* \*